(12) United States Patent  (10) Patent No.: US 9,129,665 B2
Lucas et al.  (45) Date of Patent: Sep. 8, 2015

(54) DYNAMIC BROWNOUT ADJUSTMENT IN A STORAGE DEVICE

(71) Applicant: SanDisk Enterprise IP LLC, Milpitas, CA (US)

(72) Inventors: Gregg S. Lucas, Tucson, AZ (US); Kenneth B. Delpapa, Natick, MA (US); Robert W. Ellis, Phoenix, AZ (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 74 days.

(21) Appl. No.: 14/135,429

(22) Filed: Dec. 19, 2013

(65) Prior Publication Data

US 2015/0170716 A1  Jun. 18, 2015

Related U.S. Application Data

(60) Provisional application No. 61/917,276, filed on Dec. 17, 2013.

(51) Int. Cl.
*G11C 7/00* (2006.01)
*G11C 5/14* (2006.01)

(52) U.S. Cl.
CPC ...................................... *G11C 5/148* (2013.01)

(58) Field of Classification Search
CPC .... G11C 16/30; G11C 5/145; G11C 11/4074; G11C 5/147
USPC ......................... 365/226, 227, 189.05, 189.09
See application file for complete search history.

(56) References Cited

U.S. PATENT DOCUMENTS

| 4,916,652 | A | 4/1990 | Schwarz et al. |
| 5,270,979 | A | 12/1993 | Harari et al. |
| 5,329,491 | A | 7/1994 | Brown et al. |
| 5,519,847 | A | 5/1996 | Fandrich et al. |
| 5,530,705 | A | 6/1996 | Malone, Sr. |
| 5,537,555 | A | 7/1996 | Landry et al. |

(Continued)

FOREIGN PATENT DOCUMENTS

| EP | 1465203 A1 | 10/2004 |
| EP | 1 990 921 A2 | 11/2008 |

(Continued)

OTHER PUBLICATIONS

Barr, Introduction to Watchdog Timers, Oct. 2001, 3 pgs.

(Continued)

*Primary Examiner* — David Lam
(74) *Attorney, Agent, or Firm* — Morgan, Lewis & Bockius LLP

(57) ABSTRACT

The various embodiments described herein include systems, methods and/or devices used to enable dynamic brownout adjustment in a storage device. In one aspect, the method includes: (1) obtaining a set of power tolerance settings, the set of power tolerance settings used for determining whether one or more power supply voltages provided to the storage device are out of range, (2) in response to a predefined trigger, adjusting the set of power tolerance settings in accordance with one or more parameters of the storage device, (3) determining, in accordance with the adjusted set of power tolerance settings, whether the one or more power supply voltages are out of range, and (4) in accordance with a determination that the one or more power supply voltages are out of range, latching a power fail condition.

20 Claims, 10 Drawing Sheets

(56) References Cited

U.S. PATENT DOCUMENTS

| | | | |
|---|---|---|---|
| 5,551,003 A | 8/1996 | Mattson et al. | |
| 5,657,332 A | 8/1997 | Auclair et al. | |
| 5,666,114 A | 9/1997 | Brodie et al. | |
| 5,708,849 A | 1/1998 | Coke et al. | |
| 5,765,185 A | 6/1998 | Lambrache et al. | |
| 5,943,692 A | 8/1999 | Marberg et al. | |
| 5,982,664 A | 11/1999 | Watanabe | |
| 6,000,006 A | 12/1999 | Bruce et al. | |
| 6,006,345 A | 12/1999 | Berry, Jr. | |
| 6,016,560 A | 1/2000 | Wada et al. | |
| 6,018,304 A | 1/2000 | Bessios | |
| 6,070,074 A | 5/2000 | Perahia et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh | |
| 6,311,263 B1 | 10/2001 | Barlow et al. | |
| 6,412,042 B1 | 6/2002 | Paterson et al. | |
| 6,442,076 B1 | 8/2002 | Roohparvar | |
| 6,449,625 B1 | 9/2002 | Wang | |
| 6,484,224 B1 | 11/2002 | Robins et al. | |
| 6,516,437 B1 | 2/2003 | Van Stralen et al. | |
| 6,564,285 B1 | 5/2003 | Mills et al. | |
| 6,678,788 B1 | 1/2004 | O'Connell | |
| 6,757,768 B1 | 6/2004 | Potter et al. | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,871,257 B2 | 3/2005 | Conley et al. | |
| 6,895,464 B2 | 5/2005 | Chow et al. | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 7,020,017 B2 | 3/2006 | Chen et al. | |
| 7,028,165 B2 | 4/2006 | Roth et al. | |
| 7,032,123 B2 | 4/2006 | Kane et al. | |
| 7,043,505 B1 | 5/2006 | Teague et al. | |
| 7,100,002 B2 | 8/2006 | Shrader | |
| 7,111,293 B1 | 9/2006 | Hersh et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,328,377 B1 | 2/2008 | Lewis et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,571,277 B2 | 8/2009 | Mizushima | |
| 7,574,554 B2 | 8/2009 | Tanaka et al. | |
| 7,596,643 B2 | 9/2009 | Merry, Jr. et al. | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,954,041 B2 | 5/2011 | Hong et al. | |
| 7,971,112 B2 | 6/2011 | Murata | |
| 7,974,368 B2 | 7/2011 | Shieh et al. | |
| 7,978,516 B2 | 7/2011 | Olbrich et al. | |
| 7,996,642 B1 | 8/2011 | Smith | |
| 8,006,161 B2 | 8/2011 | Lestable et al. | |
| 8,032,724 B1 | 10/2011 | Smith | |
| 8,042,011 B2 | 10/2011 | Nicolaidis et al. | |
| 8,069,390 B2 | 11/2011 | Lin | |
| 8,190,967 B2 | 5/2012 | Hong et al. | |
| 8,254,181 B2 | 8/2012 | Hwang et al. | |
| 8,259,506 B1 | 9/2012 | Sommer et al. | |
| 8,312,349 B2 | 11/2012 | Reche et al. | |
| 8,412,985 B1 | 4/2013 | Bowers et al. | |
| 8,438,459 B2 | 5/2013 | Cho et al. | |
| 8,453,022 B2 | 5/2013 | Katz | |
| 8,634,248 B1 | 1/2014 | Sprouse et al. | |
| 8,885,434 B2 * | 11/2014 | Kumar | 365/226 |
| 8,923,066 B1 | 12/2014 | Subramanian et al. | |
| 2001/0050824 A1 | 12/2001 | Buch | |
| 2002/0024846 A1 | 2/2002 | Kawahara et al. | |
| 2002/0083299 A1 | 6/2002 | Van Huben et al. | |
| 2002/0122334 A1 | 9/2002 | Lee et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid et al. | |
| 2003/0088805 A1 | 5/2003 | Majni et al. | |
| 2003/0093628 A1 | 5/2003 | Matter et al. | |
| 2003/0163629 A1 | 8/2003 | Conley et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0057575 A1 | 3/2004 | Zhang et al. | |
| 2004/0062157 A1 | 4/2004 | Kawabe | |
| 2004/0073829 A1 | 4/2004 | Olarig | |
| 2004/0148561 A1 | 7/2004 | Shen et al. | |
| 2004/0153902 A1 | 8/2004 | Machado et al. | |
| 2004/0181734 A1 | 9/2004 | Saliba | |
| 2004/0199714 A1 | 10/2004 | Estakhri et al. | |
| 2004/0237018 A1 | 11/2004 | Riley | |
| 2005/0060456 A1 | 3/2005 | Shrader et al. | |
| 2005/0060501 A1 | 3/2005 | Shrader | |
| 2005/0073884 A1 | 4/2005 | Gonzalez et al. | |
| 2005/0114587 A1 | 5/2005 | Chou et al. | |
| 2005/0172065 A1 | 8/2005 | Keays | |
| 2005/0172207 A1 | 8/2005 | Radke et al. | |
| 2005/0193161 A1 | 9/2005 | Lee et al. | |
| 2005/0201148 A1 | 9/2005 | Chen et al. | |
| 2005/0231765 A1 | 10/2005 | So et al. | |
| 2005/0249013 A1 | 11/2005 | Janzen et al. | |
| 2005/0251617 A1 | 11/2005 | Sinclair et al. | |
| 2005/0257120 A1 | 11/2005 | Gorobets et al. | |
| 2005/0273560 A1 | 12/2005 | Hulbert et al. | |
| 2005/0289314 A1 | 12/2005 | Adusumilli et al. | |
| 2006/0039196 A1 | 2/2006 | Gorobets et al. | |
| 2006/0039227 A1 | 2/2006 | Lai et al. | |
| 2006/0053246 A1 | 3/2006 | Lee | |
| 2006/0085671 A1 | 4/2006 | Majni et al. | |
| 2006/0087893 A1 | 4/2006 | Nishihara et al. | |
| 2006/0107181 A1 | 5/2006 | Dave et al. | |
| 2006/0136570 A1 | 6/2006 | Pandya | |
| 2006/0156177 A1 | 7/2006 | Kottapalli et al. | |
| 2006/0195650 A1 | 8/2006 | Su et al. | |
| 2006/0244049 A1 | 11/2006 | Yaoi et al. | |
| 2006/0259528 A1 | 11/2006 | Dussud et al. | |
| 2006/0291301 A1 | 12/2006 | Ziegelmayer | |
| 2007/0011413 A1 | 1/2007 | Nonaka et al. | |
| 2007/0058446 A1 | 3/2007 | Hwang et al. | |
| 2007/0061597 A1 | 3/2007 | Holtzman et al. | |
| 2007/0076479 A1 | 4/2007 | Kim et al. | |
| 2007/0081408 A1 | 4/2007 | Kwon et al. | |
| 2007/0083697 A1 | 4/2007 | Birrell et al. | |
| 2007/0091677 A1 | 4/2007 | Lasser et al. | |
| 2007/0113019 A1 | 5/2007 | Beukema et al. | |
| 2007/0133312 A1 | 6/2007 | Roohparvar | |
| 2007/0147113 A1 | 6/2007 | Mokhlesi et al. | |
| 2007/0150790 A1 | 6/2007 | Gross et al. | |
| 2007/0157064 A1 | 7/2007 | Falik et al. | |
| 2007/0174579 A1 | 7/2007 | Shin | |
| 2007/0180188 A1 | 8/2007 | Fujibayashi et al. | |
| 2007/0201274 A1 | 8/2007 | Yu et al. | |
| 2007/0208901 A1 | 9/2007 | Purcell et al. | |
| 2007/0234143 A1 | 10/2007 | Kim | |
| 2007/0245061 A1 | 10/2007 | Harriman | |
| 2007/0277036 A1 | 11/2007 | Chamberlain et al. | |

(56) References Cited

U.S. PATENT DOCUMENTS

| | | |
|---|---|---|
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0037652 A1 | 2/2009 | Yu et al. |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0118608 A1 | 5/2010 | Song et al. |
| 2010/0153616 A1 | 6/2010 | Garratt |
| 2010/0161936 A1 | 6/2010 | Royer et al. |
| 2010/0174959 A1 | 7/2010 | No et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2011/0051513 A1 | 3/2011 | Shen et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0173378 A1 | 7/2011 | Filor et al. |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2012/0096217 A1 | 4/2012 | Son et al. |
| 2012/0110250 A1 | 5/2012 | Sabbag et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0185750 A1 | 7/2012 | Hayami |
| 2012/0195126 A1 | 8/2012 | Roohparvar |
| 2012/0233391 A1 | 9/2012 | Frost et al. |
| 2012/0239858 A1 | 9/2012 | Melik-Martirosian |
| 2012/0239976 A1 | 9/2012 | Cometti et al. |
| 2012/0284587 A1 | 11/2012 | Yu et al. |
| 2013/0031438 A1 | 1/2013 | Hu et al. |
| 2013/0036418 A1 | 2/2013 | Yadappanavar et al. |
| 2013/0047045 A1 | 2/2013 | Hu et al. |
| 2013/0073924 A1 | 3/2013 | D'Abreu et al. |
| 2013/0111279 A1 | 5/2013 | Jeon et al. |
| 2013/0121084 A1 | 5/2013 | Jeon et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0232289 A1 | 9/2013 | Zhong et al. |
| 2013/0258738 A1 | 10/2013 | Barkon et al. |
| 2013/0265838 A1 | 10/2013 | Li |
| 2013/0301373 A1 | 11/2013 | Tam |
| 2013/0343131 A1 | 12/2013 | Wu et al. |
| 2014/0013188 A1 | 1/2014 | Wu et al. |
| 2014/0063905 A1 | 3/2014 | Ahn et al. |
| 2014/0095775 A1 | 4/2014 | Talagala et al. |
| 2014/0122818 A1 | 5/2014 | Hayasaka et al. |
| 2014/0136927 A1 | 5/2014 | Li et al. |
| 2014/0143505 A1 | 5/2014 | Sim et al. |
| 2014/0201596 A1 | 7/2014 | Baum et al. |

FOREIGN PATENT DOCUMENTS

| | | |
|---|---|---|
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.

(56) References Cited

OTHER PUBLICATIONS

Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
International Search Report and Written Opinion dated Jul. 25, 2014, received in International Patent Application No. PCT/US2014/029453, which corresponds to U.S. Appl. No. 13/963,444, 9 pages (Frayer).
International Search Report and Written Opinion dated Mar. 7, 2014, received in International Patent Application No. PCT/U32013/074772, which corresponds to U.S. Appl. No. 13/831,218, 10 pages (George).
International Search Report and Written Opinion dated Mar. 24, 2014, received in International Patent Application No. PCT/US20131074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Invitation to Pay Additional Fees dated Feb. 13, 2015, received in International Patent Application No. PCT/US2014/063949, which corresponds to U.S. Appl. No. 14/135,433, 6 pages (Delpapa).
International Search Report and Written Opinion dated Jan. 21, 2015, received in International Application No. PCT/US2014/059748, which corresponds to U.S. Appl. No. 14/137,511, 13 pages (Dancho).
International Search Report and Written Opinion dated Feb. 18, 2015, received in International Application No. PCT/US2014/066921, which corresponds to U.S. Appl. No. 14/135,260, 13 pages (Fitzpatrick).

\* cited by examiner

DYNAMIC BROWNOUT ADJUSTMENT IN A STORAGE DEVICE

RELATED APPLICATION

This application claims priority to U.S. Provisional Patent Application Ser. No. 61/917,276, filed Dec. 17, 2013, which is hereby incorporated by reference in its entirety.

TECHNICAL FIELD

The disclosed embodiments relate generally to memory systems, and in particular, to dynamic brownout adjustment in a storage device.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Data hardening, the saving of data and mission critical metadata held in volatile storage, is important for a storage device. When there is a power failure, mission critical data may reside in volatile memory in a number of sub-system components. Coordinating and managing multiple sub-system components to ensure that volatile data is saved successfully is important for safeguarding data integrity of a storage device.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable dynamic brownout adjustment in a storage device. In one aspect, a set of obtained power tolerance settings is adjusted in accordance with one or more parameters of a storage device, the adjusted set of power tolerance settings is used to determine whether one or more power supply voltages provided to the storage device are out of range, and a power fail condition is latched in accordance with a determination that one or more power supply voltages are out of range.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
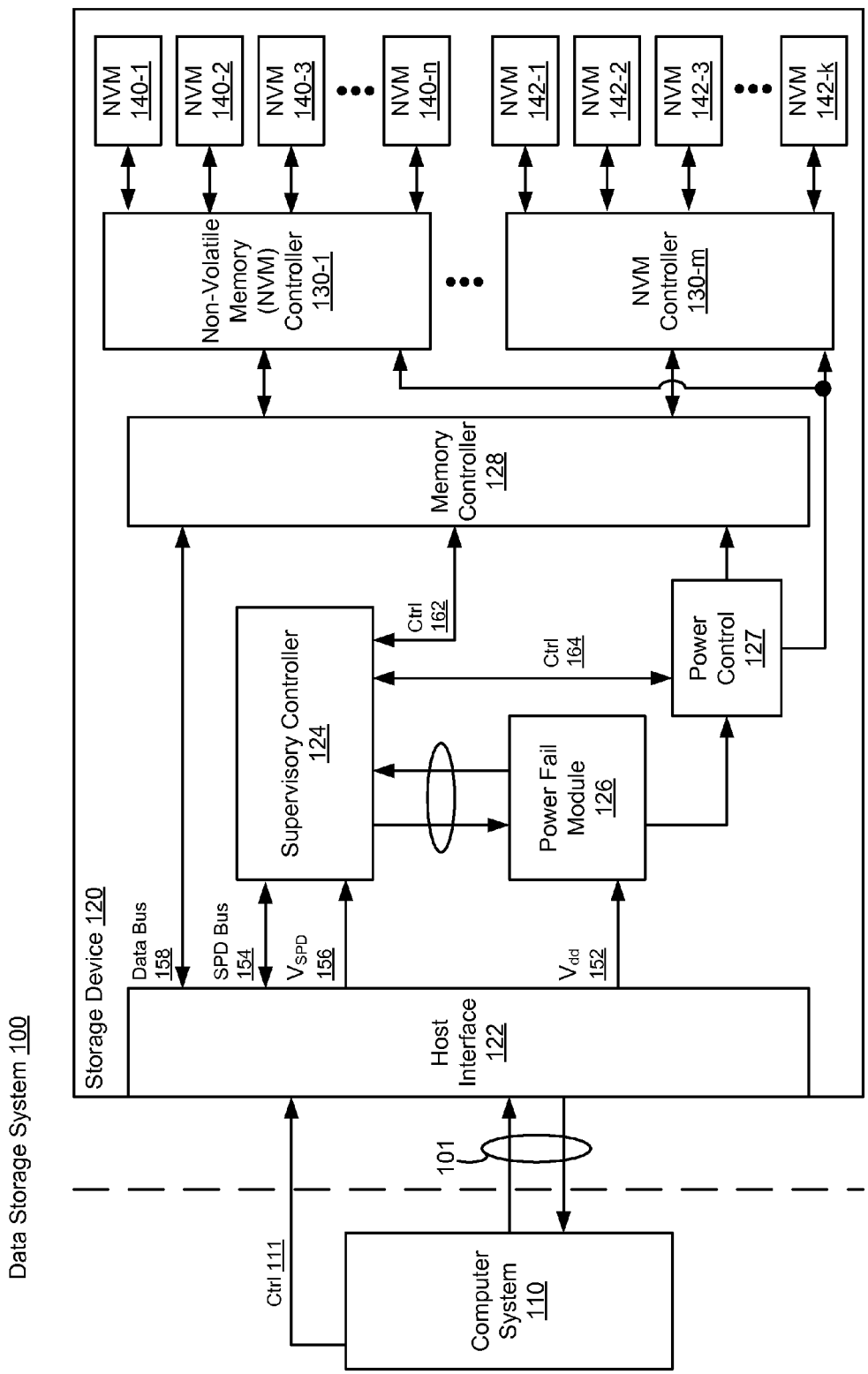
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices for dynamic brownout adjustment in a storage device. Some implementations include systems, methods and/or devices to adjust a set of obtained power tolerance settings in accordance with one or more parameters of a storage device, determine, in accordance with the adjusted set of power tolerance settings, whether one or more power supply voltages provided to the storage device are out of range, and latch a power fail condition in accordance with a determination that the one or more power supply voltages are out of range.

More specifically, some embodiments include a method of protecting data in a storage device. In some embodiments, the method includes: (1) obtaining a set of power tolerance settings, the set of power tolerance settings used for determining whether one or more power supply voltages provided to the storage device are out of range, (2) in response to a predefined trigger, adjusting the set of power tolerance settings in accordance with one or more parameters of the storage device, (3) determining, in accordance with the adjusted set of power tolerance settings, whether the one or more power supply voltages are out of range, and (4) in accordance with a determination that the one or more power supply voltages are out of range, latching a power fail condition.

In some embodiments, the one or more power supply voltages provided to the storage device include a voltage supplied for serial presence detect (SPD) functionality.

In some embodiments, the one or more power supply voltages provided to the storage device include a first power supply voltage and a second power supply voltage, and the second power supply voltage is a voltage supplied for serial presence detect (SPD) functionality and the first power supply voltage is lower than the second power supply voltage.

In some embodiments, adjusting the set of power tolerance settings in accordance with one or more parameters of the storage device includes adjusting the set of power tolerance settings in accordance with a workload metric.

In some embodiments, adjusting the set of power tolerance settings in accordance with one or more parameters of the storage device includes adjusting the set of power tolerance settings in accordance with one or more operating conditions.

In some embodiments, adjusting the set of power tolerance settings in accordance with one or more parameters of the storage device includes adjusting the set of power tolerance settings in accordance with a user-selectable guide.

In some embodiments, adjusting the set of power tolerance settings in accordance with one or more parameters of the storage device includes adjusting the set of power tolerance settings in accordance with one or more internally generated signals, internally generated within the storage device.

In some embodiments, adjusting the set of power tolerance settings in accordance with one or more parameters of the storage device includes adjusting the set of power tolerance settings in accordance with one or more commands from a host system.

In some embodiments, adjusting the set of power tolerance settings in accordance with one or more parameters of the storage device includes adjusting the set of power tolerance settings in accordance with (i) one or more internally generated signals, internally generated within the storage device and (ii) one or more commands from a host system. The one or more commands from the host system have higher priority than the one or more internally generated signals.

In some embodiments, the storage device includes a dual in-line memory module (DIMM) device.

In another aspect, any of the methods described above are performed by a storage device including an interface for operatively coupling the storage device with a host system. The storage device is configured to (1) obtain a set of power tolerance settings, the set of power tolerance settings used for determining whether one or more power supply voltages provided to the storage device are out of range, (2) adjust the set of power tolerance settings in accordance with one or more parameters of the storage device, (3) determine, in accordance with the adjusted set of power tolerance settings, whether the one or more power supply voltages are out of range, and (4) in accordance with a determination that the one or more power supply voltages are out of range, latch a power fail condition.

In some embodiments, the storage device includes a supervisory controller with one or more processors and memory. In some embodiments, the storage device includes a power fail module. In some embodiments, the storage device includes a plurality of controllers.

In yet another aspect, any of the methods described above is performed by a storage device including an interface for operatively coupling the storage device with a host system and means for performing any of the methods described herein.

In yet another aspect, some embodiments include a non-transitory computer readable storage medium, storing one or more programs for execution by one or more processors of a storage device, the one or more programs including instructions for performing any of the methods described herein.

In some embodiments, the storage device includes a plurality of controllers and a supervisory controller, and the non-transitory computer readable storage medium includes a non-transitory computer readable storage medium associated with each of the plurality of controllers on the storage device and a non-transitory computer readable storage medium associated with the supervisory controller.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a block diagram illustrating an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes storage device 120, which includes host interface 122, supervisory controller 124, power fail module 126, power control 127, memory controller 128, one or more non-volatile memory (NVM) controllers 130 (e.g., NVM controller 130-1 through NVM controller 130-$m$), and non-volatile memory (NVM) (e.g., one or more NVM device(s) 140, 142 such as one or more flash memory devices), and is used in conjunction with computer system 110.

Computer system 110 is coupled with storage device 120 through data connections 101. However, in some embodiments, computer system 110 includes storage device 120 as a component and/or sub-system. Computer system 110 may be any suitable computing device, such as a personal computer, a workstation, a computer server, or any other computing device. Computer system 110 is sometimes called a host or host system. In some embodiments, computer system 110 includes one or more processors, one or more types of memory, optionally includes a display and/or other user interface components such as a keyboard, a touch screen display, a mouse, a track-pad, a digital camera and/or any number of supplemental devices to add functionality. Further, in some embodiments, computer system 110 sends one or more host commands (e.g., read commands and/or write commands) on control line 111 to storage device 120. In some embodiments, computer system 110 is a server system, such as a server system in a data center, and does not have a display and other user interface components.

In some embodiments, storage device 120 includes a single NVM device (e.g., a single flash memory device) while in other embodiments storage device 120 includes a plurality of NVM devices (e.g., a plurality of flash memory devices). In some embodiments, NVM devices 140, 142 include NAND-type flash memory or NOR-type flash memory. Further, in some embodiments, NVM controller 130 is a solid-state drive (SSD) controller. However, one or more other types of storage media may be included in accordance with aspects of a wide variety of implementations. In some embodiments, storage device 120 is or includes a dual in-line memory module (DIMM) device. In some embodiments, storage device 120 is compatible with a DIMM memory slot. For example, in some embodiments, storage device 120 is compatible with a 240-pin DIMM memory slot and is compatible with signaling in accordance with a double data rate type three synchronous dynamic random access memory (DDR3) interface specification.

In some embodiments, storage device 120 includes NVM devices 140, 142 (e.g., NVM devices 140-1 through 140-$n$ and NVM devices 142-1 through 142-$k$) and NVM controllers 130 (e.g., NVM controllers 130-1 through 130-$m$). In some embodiments, each NVM controller of NVM controllers 130 include one or more processing units (sometimes called CPUs or processors or microprocessors or microcontrollers) configured to execute instructions in one or more programs (e.g., in NVM controllers 130). NVM devices 140, 142 are coupled with NVM controllers 130 through connections that typically convey commands in addition to data, and, optionally, convey metadata, error correction information and/or other information in addition to data values to be stored in NVM devices 140, 142 and data values read from NVM devices 140, 142. For example, NVM devices 140, 142 can be configured for enterprise storage suitable for applications such as cloud computing, or for caching data stored (or to be stored) in secondary storage, such as hard disk drives. Additionally and/or alternatively, flash memory (e.g., NVM devices 140, 142) can also be configured for relatively smaller-scale applications such as personal flash drives or hard-disk replacements for personal, laptop and tablet computers. Although flash memory devices and flash controllers are used as an example here, in some embodiments storage device 120 includes other non-volatile memory device(s) and corresponding non-volatile memory controller(s).

In some embodiments, storage device 120 also includes host interface 122, supervisory controller 124, power fail module 126, power control 127, and memory controller 128, or a superset or subset thereof. Storage device 120 may include various additional features that have not been illustrated for the sake of brevity and so as not to obscure more pertinent features of the example implementations disclosed herein, and a different arrangement of features may be possible. Host interface 122 provides an interface to computer system 110 through data connections 101.

In some embodiments, supervisory controller 124 includes one or more processing units (also sometimes called CPUs or processors or microprocessors or microcontrollers) configured to execute instructions in one or more programs (e.g., in supervisory controller 124). Supervisory controller 124 is typically coupled with host interface 122, power fail module 126, power control 127, memory controller 128, and NVM controllers 130 (connection not shown) in order to coordinate the operation of these components, including supervising and controlling functions such as power up, power down, data hardening, charging energy storage device(s), data logging, and other aspects of managing functions on storage device 120. Supervisory controller 124 is coupled with host interface 122 via serial presence detect (SPD) bus 154 and receives supply voltage line $V_{SPD}$ 156 from the host interface 122. $V_{SPD}$ 156 is typically a standardized voltage (e.g., 3.3 volts). Serial presence detect (SPD) refers to a standardized way to automatically access information about a computer memory module (e.g., storage device 120). In some embodiments, supervisory controller 124 includes circuitry configured to monitor an input voltage (e.g., $V_{SPD}$ 156). In some embodiments, if the memory module has a failure, the failure can be communicated with a host system (e.g., computer system 110) via SPD bus 154.

Power fail module 126 is typically coupled with host interface 122, supervisory controller 124, and power control 127. Power fail module 126 is configured to monitor one or more input voltages (e.g., $V_{dd}$ 152 and, optionally, $V_{SPD}$ 156 if provided to power fail module 126) provided to storage device 120 by a host system (e.g., computer system 110). In response to detecting a power fail condition (e.g., an under or over voltage event) of an input voltage, power fail module 126 is configured to provide a $V_{dd}$ PFAIL signal to supervisory controller 124. In some embodiments, in response to detecting the power fail condition, power fail module 126 discharges an energy storage device to provide power to memory controller 128 and NVM controllers 130. Power fail module 126 is described in further detail below with respect to FIGS. 3, 4A-4B, and 5. In response to receiving a PFAIL signal indicating a power fail condition (e.g., a $V_{dd}$ PFAIL signal from power fail module 126 or a $V_{SPD}$ PFAIL signal from voltage monitoring circuitry within supervisory controller 124), supervisory controller 124 performs one or more operations of a power fail process including, but not limited to, signaling the power fail condition to a plurality of controllers on storage device 120 (e.g., memory controller 128 and NVM controllers 130) via control lines 162 (connection to NVM controllers 130 not shown).

Power control 127 is typically coupled with supervisory controller 124, power fail module 126, memory controller 128, and NVM controllers 130 in order to provide power to these components. In some embodiments, power control 127 includes one or more voltage regulators (sometimes called power regulators) controlled by supervisory controller 124 via control line 164. Furthermore, in some embodiments, power control 127 is configured to remove power from a specified NVM controller 130 in response to a command from supervisory controller 124 via control line 164.

Memory controller 128 is typically coupled with host interface 122, supervisory controller 124, power control 127, and NVM controllers 130. In some embodiments, during a write operation, memory controller 128 receives data via data bus 158 from computer system 110 through host interface 122 and during a read operation, memory controller 128 sends data to computer system 110 through host interface 122 via data bus 158. Further, host interface 122 provides additional data, signals, voltages, and/or other information needed for communication between memory controller 128 and computer system 110. In some embodiments, memory controller 128 and host interface 122 use a defined interface standard for communication, such as double data rate type three synchronous dynamic random access memory (DDR3). In some embodiments, memory controller 128 and NVM controllers 130 use a defined interface standard for communication, such as serial advance technology attachment (SATA). In some other embodiments, the device interface used by memory controller 128 to communicate with NVM controllers 130 is SAS (serial attached SCSI), or other storage interface. In some embodiments, memory controller 128 maps DDR interface commands from the host system (e.g., computer system 1120) to SATA or SAS interface commands for the plurality of controllers (e.g., memory controller 128 and NVM controllers 130). In some embodiments, memory controller 128 includes one or more processing units (also sometimes called CPUs or processors or microprocessors or microcontrollers) configured to execute instructions in one or more programs (e.g., in memory controller 128).

Figure 2A:
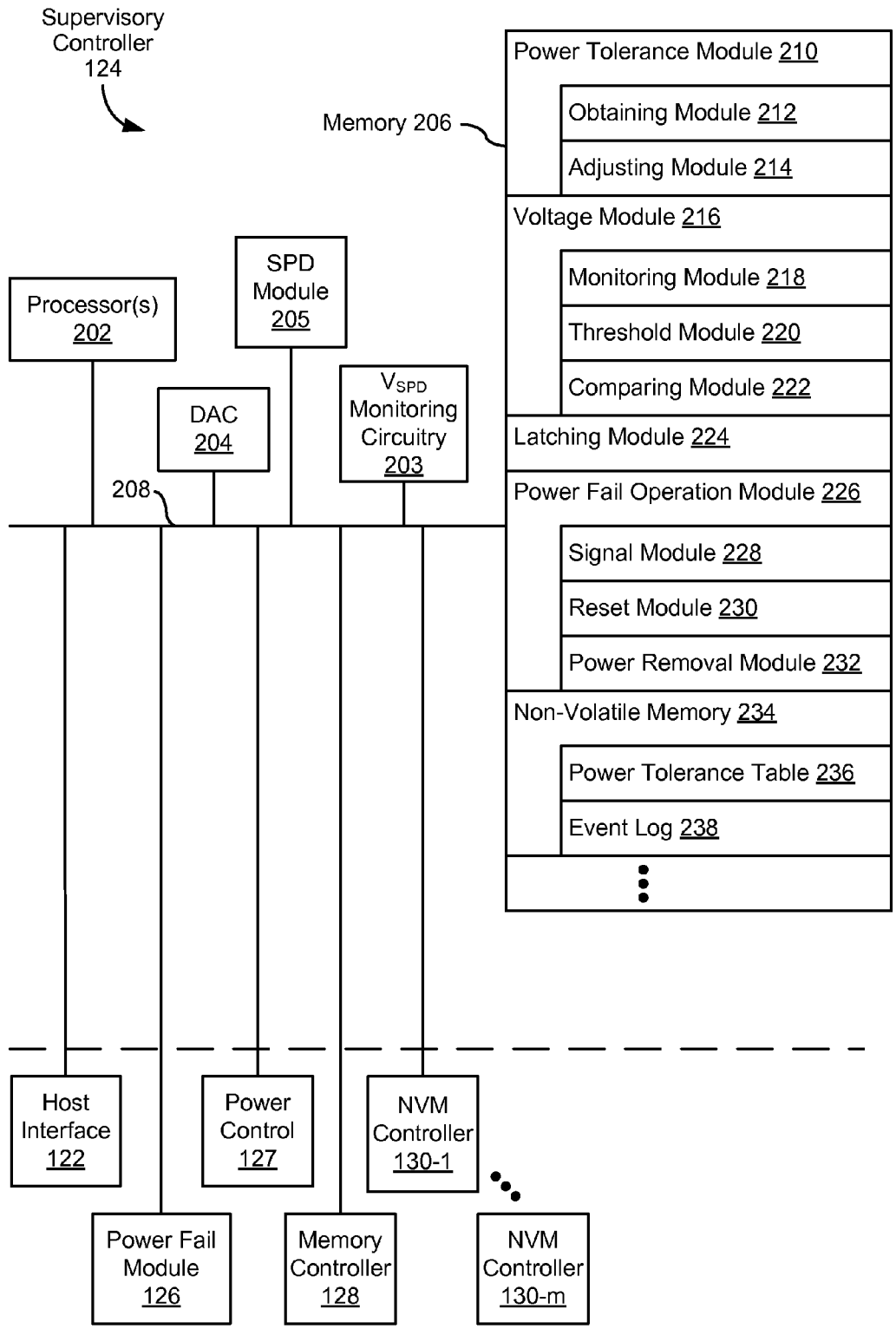
FIG. 2A is a block diagram illustrating an implementation of a supervisory controller, in accordance with some embodiments.

FIG. 2A is a block diagram illustrating an implementation of supervisory controller 124, in accordance with some embodiments. Supervisory controller 124 includes one or more processors 202 (sometimes called CPUs or processing units or microprocessors or microcontrollers) for executing modules, programs and/or instructions stored in memory 206 and thereby performing processing operations, serial presence detect (SPD) module 205 (e.g., non-volatile memory) storing information related to storage device 120 (e.g., a serial number, memory type, supported communication protocol, etc.), memory 206, optionally a digital-to-analog converter (DAC) 204 for converting digital values to an analog signal (e.g., a portion of an integrated or partially integrated DAC/ADC), optionally $V_{SPD}$ monitoring circuitry 203 configured to detect an under or over voltage event as to $V_{SPD}$ (e.g., $V_{SPD}$ 156, FIG. 1), and one or more communication buses 208 for interconnecting these components. Communication buses 208, optionally, include circuitry (sometimes called a chipset) that interconnects and controls communications between system components. In some embodiments, supervisory controller 124 is coupled with host interface 122, power fail module 126, power control 127, memory controller 128, and NVM controllers 130 (e.g., NVM controllers 130-1 through 130-$m$) by communication buses 208.

Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206, optionally, includes one or more storage devices remotely located from processor(s) 202. Memory 206, or alternately the non-volatile memory device(s) within memory 206, comprises a non-transitory computer readable storage medium. In some embodiments, memory 206, or the computer readable storage medium of memory 206, stores the following programs, modules, and data structures, or a subset or superset thereof:

power tolerance module 210 that is used for obtaining and/or adjusting a set of power tolerance settings for a storage device (e.g., storage device 120, FIG. 1), the set of power tolerance settings used for determining whether one or more power supply voltages provided to the storage device are out of range, power tolerance module 210 optionally including:
 obtaining module 212 that is used for obtaining a set of power tolerance settings; and
 adjusting module 214 that is used for adjusting, in response to a predefined trigger, the set of power tolerance settings in accordance with one or more parameters of the storage device;
voltage module 216 that is used for determining, in accordance with the adjusted set of power tolerance settings, whether the one or more power supply voltages are out of range, optionally including:
 monitoring module 218 that is used for monitoring the one or more power supply voltages;
 threshold module 220 that is used for obtaining one or more thresholds corresponding to the one or more power supply voltages, respectively; and
 comparing module 222 that is used for comparing the one or more power supply voltages with the respective one or more thresholds;
latching module 224 that is used for latching or unlatching a power fail condition (e.g., by controlling latching mechanism 412, FIG. 4A);
power fail operation module 226 that is used for performing a power fail operation in accordance with a power fail condition, optionally including:
 signal module 228 that is used for signaling a power fail condition to a plurality of controllers on the storage device (e.g., memory controller 128 and NVM controllers 130, FIG. 1);
 reset module 230 that is used for resetting the plurality of controllers on the storage device; and
 power removal module 232 that is used for removing power from the plurality of controllers on the storage device (e.g., by controlling power control 127, FIG. 1); and non-volatile memory 234 for storing information related to the operations of the storage device, optionally including:
 power tolerance table 236 for storing a plurality of predefined power tolerance settings (e.g., under-voltage thresholds, under-voltage time periods, over-voltage thresholds, and/or over-voltage time periods associated with various power supply voltages); and
 event log 238 for storing information related to events on the storage device (e.g., the time and occurrence of a power fail condition).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, include instructions for implementing any of the methods described below with reference to FIGS. 6A-6B.

Although FIG. 2A shows supervisory controller 124 in accordance with some embodiments, FIG. 2A is intended more as a functional description of the various features which may be present in supervisory controller 124 than as a structural schematic of the embodiments described herein. In practice, and as recognized by those of ordinary skill in the art, items shown separately could be combined and some items could be separated.

Figure 2B:
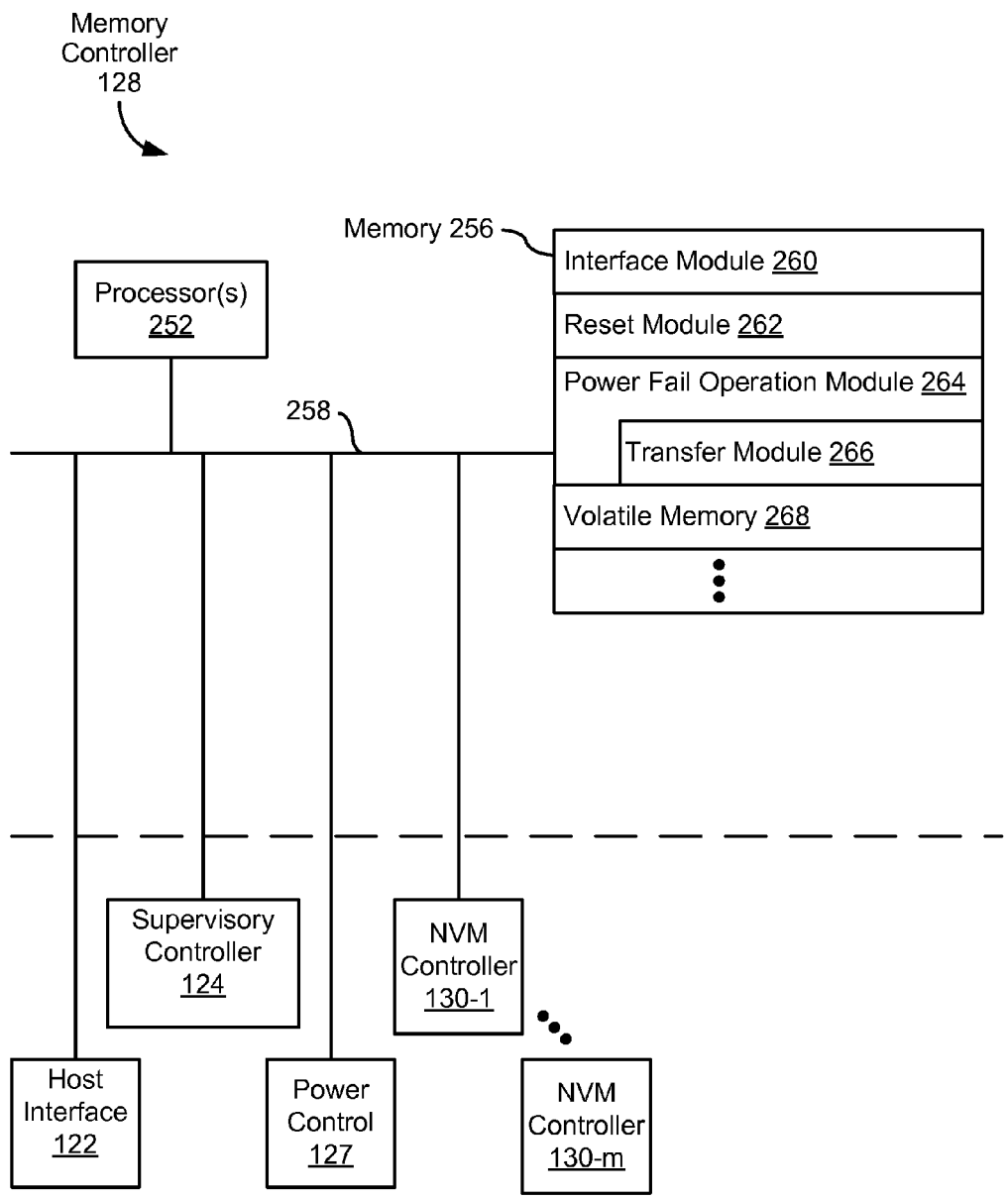
FIG. 2B is a block diagram illustrating an implementation of a memory controller, in accordance with some embodiments.

FIG. 2B is a block diagram illustrating an implementation of memory controller 128, in accordance with some embodiments. Memory controller 128, typically, includes one or more processors 252 (sometimes called CPUs or processing units or microprocessors or microcontrollers) for executing modules, programs and/or instructions stored in memory 256 and thereby performing processing operations, memory 256, and one or more communication buses 258 for interconnecting these components. Communication buses 258, optionally, include circuitry (sometimes called a chipset) that interconnects and controls communications between system components. In some embodiments, memory controller 128 is coupled with host interface 122, supervisory controller 124, power control 127, and NVM controllers 130 (e.g., NVM controllers 130-1 through 130-$m$) by communication buses 258.

Memory 256 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 256, optionally, includes one or more storage devices remotely located from processor(s) 252. Memory 256, or alternately the non-volatile memory device(s) within memory 256, comprises a non-transitory computer readable storage medium. In some embodiments, memory 256, or the computer readable storage medium of memory 256, stores the following programs, modules, and data structures, or a subset or superset thereof:

interface module 260 for communicating with other components, such as host interface 122, supervisory controller 124, power control 127, and NVM controllers 130;

reset module 262 for resetting memory controller 128; and power fail operation module 264 for performing a power fail operation in response to a signal of a power fail condition from supervisory controller 124.

In some embodiments, memory 256 includes volatile memory 268 for storing data.

In some embodiments, power fail operation module 264 includes a transfer module 266 for transferring data held in volatile memory 268 to non-volatile memory.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 256 may store a subset of the modules and data structures identified above. Furthermore, memory 256 may store additional modules and data structures not described above. In some embodiments, the programs, modules, and data structures stored in memory 256, or the computer readable storage medium of memory 256, include instructions for implementing respective operations in the methods described below with reference to FIGS. 6A-6B.

Although FIG. 2B shows memory controller 128 in accordance with some embodiments, FIG. 2B is intended more as a functional description of the various features which may be present in memory controller 128 than as a structural schematic of the embodiments described herein. In practice, and as recognized by those of ordinary skill in the art, items shown separately could be combined and some items could be separated.

Figure 2C:
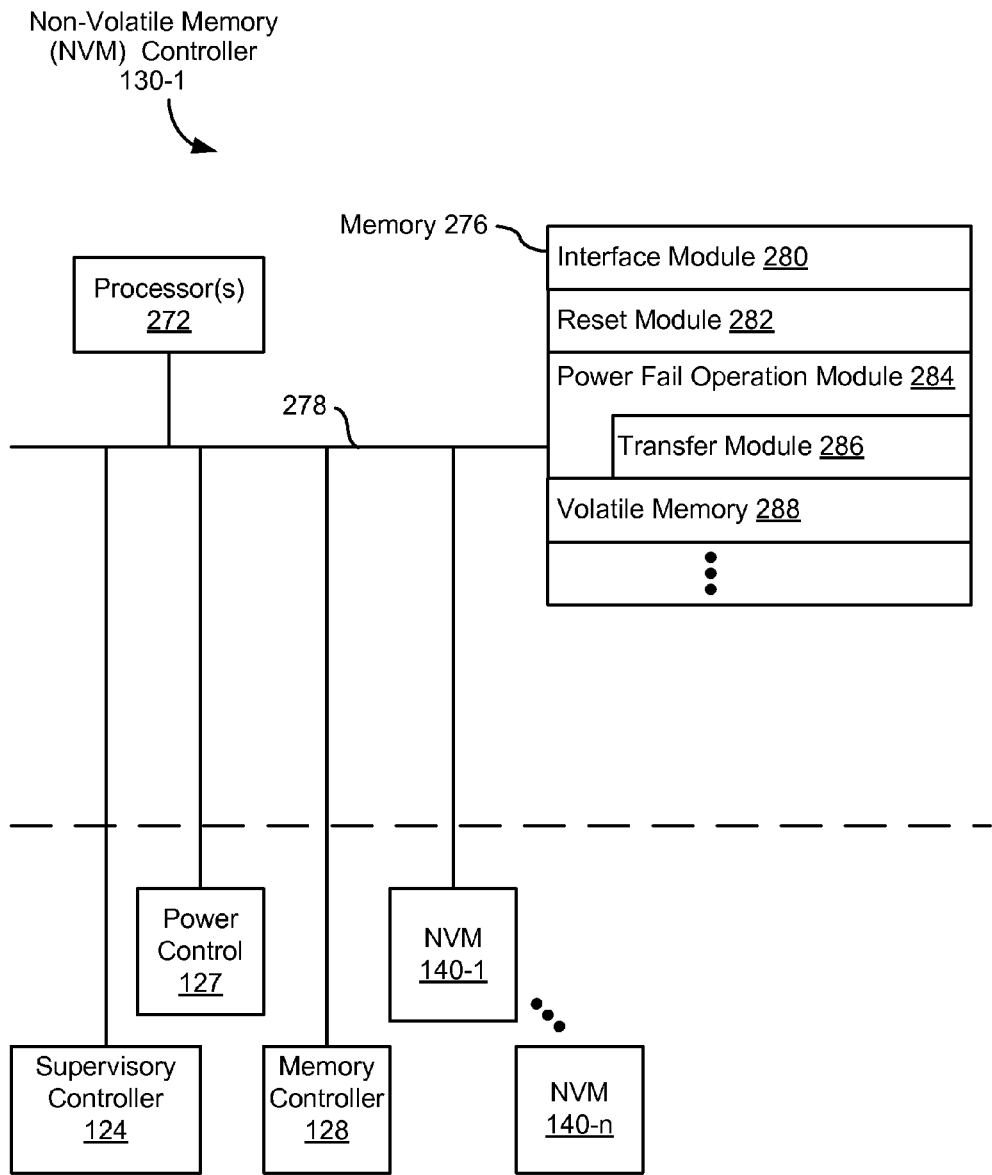
FIG. 2C is a block diagram illustrating an implementation of a non-volatile memory (NVM) controller, in accordance with some embodiments.

FIG. 2C is a block diagram illustrating an implementation of representative NVM controller 130-1, in accordance with some embodiments. NVM controller 130-1 typically includes one or more processors 272 (sometimes called CPUs or processing units or microprocessors or microcontrollers) for executing modules, programs and/or instructions stored in memory 276 and thereby performing processing operations, memory 276, and one or more communication buses 278 for interconnecting these components. Communication buses 278 optionally include circuitry (sometimes called a chipset) that interconnects and controls communications between system components. In some embodiments, NVM controller 130-1 is coupled with supervisory controller 124, power control 127, memory controller 128, and NVM devices 140 (e.g., NVM devices 140-1 through 140-n) by communication buses 278.

Memory 276 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 276, optionally, includes one or more storage devices remotely located from processor(s) 272. Memory 276, or alternately the non-volatile memory device(s) within memory 276, comprises a non-transitory computer readable storage medium. In some embodiments, memory 276, or the computer readable storage medium of memory 276, stores the following programs, modules, and data structures, or a subset or superset thereof:

interface module 280 for communicating with other components, such as supervisory controller 124, power control 127, memory controller 128, and NVM devices 140;

reset module 282 for resetting NVM controller 130-1; and power fail operation module 284 for performing a power fail operation in response to a signal of a power fail condition from supervisory controller 124.

In some embodiments, memory 276 includes volatile memory 288 for storing data.

In some embodiments, power fail operation module 284 includes a transfer module 286 for transferring data held in volatile memory 288 to non-volatile memory.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 276 may store a subset of the modules and data structures identified above. Furthermore, memory 276 may store additional modules and data structures not described above. In some embodiments, the programs, modules, and data structures stored in memory 276, or the computer readable storage medium of memory 276, include instructions for implementing respective operations in the methods described below with reference to FIGS. 6A-6B.

Although FIG. 2C shows NVM controller 130-1 in accordance with some embodiments, FIG. 2C is intended more as a functional description of the various features which may be present in NVM controller 130-1 than as a structural schematic of the embodiments described herein. In practice, and as recognized by those of ordinary skill in the art, items shown separately could be combined and some items could be separated. Further, although FIG. 2C shows representative NVM controller 130-1, the description of FIG. 2C similarly applies to other NVM controllers (e.g., NVM controllers 130-2 through 130-m) in storage device 120, as shown in FIG. 1.

Figure 3:
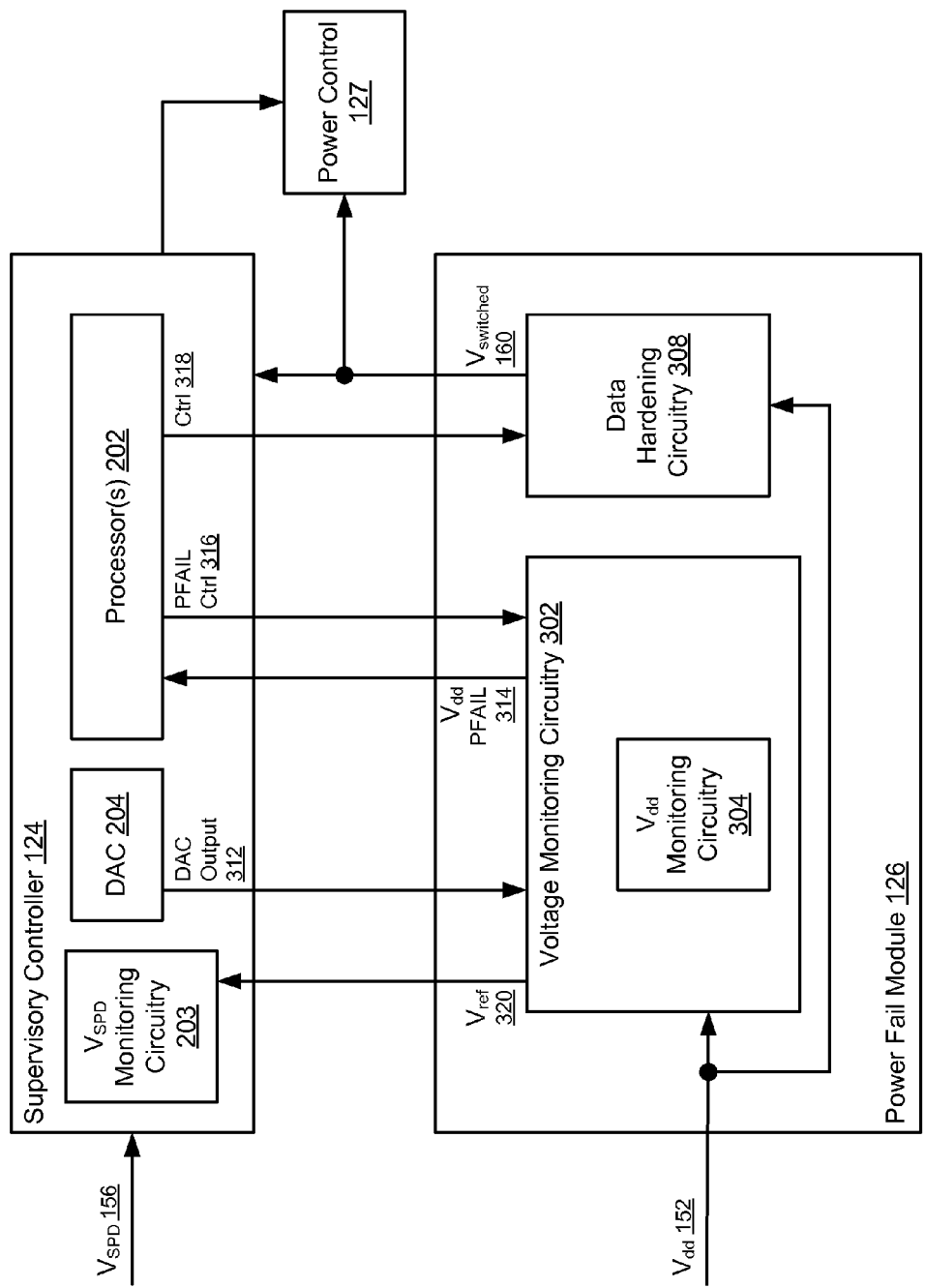
FIG. 3 is a block diagram illustrating an implementation of a portion of a storage device, in accordance with some embodiments.

FIG. 3 is a block diagram illustrating an implementation of a portion of storage device 120, in accordance with some embodiments. While some example features are illustrated, various other features have not been illustrated for the sake of brevity and so as not to obscure more pertinent aspects of the example implementations disclosed herein. To that end, as a non-limiting example, supervisory controller 124 includes one or more processors 202, DAC 204, and, optionally, $V_{SPD}$ monitoring circuitry 203, and power fail module 126 includes voltage monitoring circuitry 302 and data hardening circuitry 308. In some embodiments, DAC 204 is a component of one or more processors 202. In some embodiments, $V_{dd}$ 152 is a voltage supplied by the host system (e.g., computer system 110, FIG. 1). In some embodiments, $V_{dd}$ 152 has a target value of 1.5 volts or less (e.g., 1.25 volts, 1.35 volts, or 1.5 volts). For example, for a double data rate type three (DDR3) interface specification, $V_{dd}$ 152 is 1.25 volts, 1.35 volts or 1.5 volts. In some embodiments, $V_{SPD}$ 156 is a voltage supplied by the host system for a serial presence detect (SPD) functionality. In some embodiments, $V_{SPD}$ 156 has a target value of 3.3 volts. In some embodiments, $V_{dd}$ 152 supports a higher level of electric power consumption by supervisory controller 124 and/or operation of supervisory controller 124 at a higher performance level than when supervisory controller 124 is powered by $V_{SPD}$ 156.

In some embodiments, voltage monitoring circuitry 302 is configured to detect a power fail condition (e.g., an under or over voltage event) as to an input voltage (e.g., $V_{dd}$ 152) supplied by a host system (e.g., computer system 110, FIG. 1) and signal the power fail condition (e.g., $V_{dd}$ PFAIL 314) to supervisory controller 124. In some embodiments, voltage monitoring circuitry 302 includes $V_{dd}$ monitoring circuitry 304 configured to detect an under or over voltage event as to $V_{dd}$ 152. For a more detailed description of $V_{dd}$ monitoring circuitry 304, see the description of FIG. 4A.

In some embodiments, supervisory controller 124 includes $V_{SPD}$ monitoring circuitry 203 configured to detect an under or over voltage event as to $V_{SPD}$ 156. Although FIG. 3 shows $V_{SPD}$ monitoring circuitry 203 included in supervisory controller 124, in other embodiments, $V_{SPD}$ monitoring circuitry 203 is included in voltage monitoring circuitry 302 in power fail module 126. For a more detailed description of $V_{SPD}$ monitoring circuitry 203, see the description of FIG. 4B. Further, although $V_{SPD}$ monitoring circuitry 203 and DAC 204 are shown in FIG. 3 as separate modules, in other embodiments, $V_{SPD}$ monitoring circuitry 203 and/or DAC 204 are embedded in processor(s) 202.

In some embodiments, data hardening circuitry 308 is configured to interconnect an energy storage device to provide power to memory controller 128 and NVM controllers 130. Data hardening circuitry 308 is described in further detail below with respect to FIG. 5. For further description of data hardening circuitry 308, see U.S. Provisional Patent Application Ser. No. 61/887,910, filed Oct. 7, 2013, entitled "Power Sequencing and Data Hardening Circuitry Architecture," which is incorporated by reference herein in its entirety.

Figure 4A:
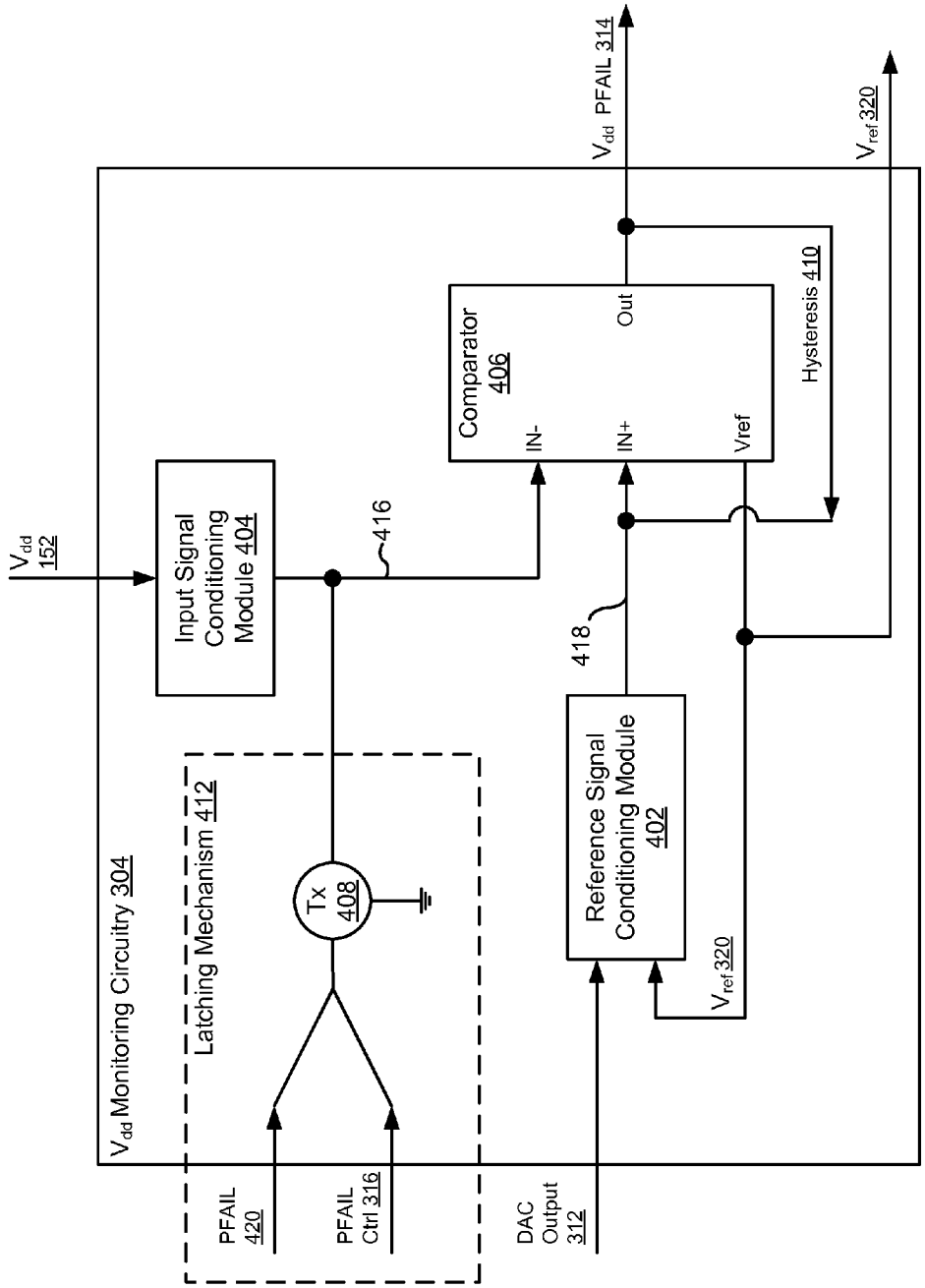
FIG. 4A is a block diagram illustrating an implementation of a portion of voltage monitoring circuitry, in accordance with some embodiments.

FIG. 4A is a block diagram illustrating an implementation of a portion of voltage monitoring circuitry 302 ($V_{dd}$ monitoring circuitry 304), in accordance with some embodiments. While some example features are illustrated, various other features have not been illustrated for the sake of brevity and so as not to obscure more pertinent aspects of the example implementations disclosed herein. To that end, as a non-limiting example, $V_{dd}$ monitoring circuitry 304 includes reference signal conditioning module 402, input signal conditioning module 404, comparator 406, and transistor 408.

In some embodiments, as shown in FIG. 3, the reference signal is DAC output 312 from supervisory controller 124. For example, supervisory controller 124 or a component thereof obtains one or more configuration parameters including an indication of the default value for $V_{dd}$ (e.g., 1.25 volts, 1.35 volts, or 1.5 volts) that is supplied to storage device 120 by the host system. In this example, supervisory controller 124 or a component thereof determines a trip voltage for $V_{dd}$ by selecting one of a plurality of predefined trip voltages (e.g., under-voltage thresholds or over-voltage thresholds in power tolerance table 236, FIG. 2A) based on the indication of the default value for $V_{dd}$ (e.g., included in the one or more configuration parameters). In some embodiments, supervisory controller 124 determines a trip voltage for $V_{dd}$ by calculating the trip point in accordance with the default value for $V_{dd}$ (e.g., 1.25 volts, 1.35 volts, or 1.5 volts) that is supplied to storage device 120 by the host system. For example, in some embodiments, if the default value for $V_{dd}$ is 1.5 volts, the under-voltage trip voltage (sometimes called under-voltage threshold) is 5% less than 1.5 volts (i.e., 1.425 volts), but if the default value for $V_{dd}$ is 1.35 volts, the under-voltage trip voltage is 2% less than 1.35 volts (i.e., 1.323 volts). After the trip voltage is determined, DAC 204 converts the digital value for the trip voltage to an analog value, and supervisory controller 124 provides DAC output 312 to $V_{dd}$ monitoring circuitry 304. In some embodiments, after the trip voltage is determined in accordance with the default value for $V_{dd}$, the trip voltage is adjusted in accordance with one or more parameters of the storage device (e.g., storage device 120, FIG. 1).

Referring once again to FIG. 4A, in some embodiments, reference signal conditioning module 402 is configured to condition DAC output 312 (sometimes called a "reference signal," "trip voltage," "trip point," "under-voltage threshold," or "over-voltage threshold") prior to a comparison operation with this reference signal. In some embodiments, the conditioning includes one or more of buffering, filtering, scaling, and level shifting DAC output 312 to produce a reference comparison signal 418. In some embodiments, conditioning module 402 is implemented using well-known circuitry components (e.g., unity gain amplifier, low-pass RC filter, voltage divider, etc.), the exact configuration of which depends on the particular conditioning applied to DAC output 312. For example, the conditioning adjusts the trip voltage so that the full range of DAC values map to the practical range of trip voltages. In some embodiments, $V_{ref}$ 320 is a voltage-supply independent reference voltage supplied by comparator 406 and used by reference signal conditioning module 402 to level shift DAC output 312. For example, in some embodiments, DAC output 312 is at a low voltage (e.g., 1 volt), and reference signal conditioning module 402 converts DAC output 312 to a proper trip voltage.

In some embodiments, input signal conditioning module 404 is configured to condition $V_{dd}$ 152 (sometimes called an "input signal," "input voltage," "supply voltage," or "power supply voltage") supplied by the host system prior to a comparison operation with this input signal. In some embodiments, the conditioning includes one or more of buffering, filtering, and scaling $V_{dd}$ 152 to produce a comparison input signal 416 corresponding to $V_{dd}$ 152. In some embodiments, input signal conditioning module 404 is implemented using well-known circuitry components (e.g., unity gain amplifier, low-pass RC filter, voltage divider, etc.), the exact configuration of which depends on the particular conditioning applied to $V_{dd}$ 152.

In some embodiments, comparator 406 is configured to perform a comparison operation between the conditioned reference signal 418 (e.g., the output of reference signal conditioning module 402) and the conditioned input signal 416 (e.g., the output of input signal conditioning module 404, and also called comparison input signal 416). When comparator 406 is configured to determine an under-voltage event, if the conditioned input signal is less than the conditioned reference signal, comparator 406 is configured to output $V_{dd}$ PFAIL signal 314 (e.g., logic high). Alternatively, when comparator 406 is configured to determine an over-voltage event, if the conditioned input signal is higher than the conditioned reference signal, comparator 406 is configured to output $V_{dd}$ PFAIL signal 314 (e.g., logic high). For example, in FIG. 4A, $V_{dd}$ PFAIL signal 314 indicates the occurrence of a power fail condition (e.g., an under or over voltage event) as to $V_{dd}$ 152. In some embodiments, comparator 406 is configured to output $V_{dd}$ PFAIL signal 314 to supervisory controller 124. Additionally, in some embodiments, comparator 406 is configured to provide hysteresis 410 of the result of the comparison operation for subsequent comparisons (e.g., 3 to 10 mV of feedback). In some embodiments, comparator 406 is also configured to provide $V_{ref}$ 320 to one or more other components of storage device 120 (e.g., supervisory controller 124 and $V_{SPD}$ monitoring circuitry 203). In some embodiments, comparator 406 includes multiple comparators (e.g., two comparators), and at least one of the multiple comparators is configured to detect an under-voltage event and at least one of the multiple comparators is configured to detect an over-voltage event. In some embodiments, comparator 406 is configured to receive multiple reference signals, and a first reference signal of the multiple reference signals is provided to determine an under-voltage event and a second reference signal of the multiple reference signals is provided to determine an over-voltage event.

In some embodiments, latching mechanism 412 is configured to latch, unlatch, or force (e.g., simulate) the power fail condition. In some embodiments, when comparator 406 indicates the occurrence of a power fail condition as to $V_{dd}$ 152 for a given time or when comparator 426 (FIG. 4B) indicates the occurrence of a power fail condition as to $V_{SPD}$ 156 for a given time, PFAIL signal 420 is provided to latching mechanism 412. In some embodiments, PFAIL signal 420 is the logical OR of $V_{dd}$ timed PFAIL (e.g., if $V_{dd}$ PFAIL signal 314 is logic high for a first time period) and $V_{SPD}$ timed PFAIL (e.g., if $V_{SPD}$ PFAIL signal 434 is logic high for a second time period). PFAIL signal 420 enables transistor 408 (closed state) which shorts the input signal (e.g., comparison input signal 416 corresponding to $V_{dd}$ 152) to ground, which latches the power fail condition. Although latching mechanism 412 is shown in FIG. 4A as included in $V_{dd}$ monitoring circuitry 304, in other embodiments, latching mechanism 412 is included in supervisory controller 124 or another module of storage device 120.

In addition to having a mechanism for latching the power fail condition, in some embodiments, supervisory controller 124 or a component thereof (e.g., latching module 218, FIG. 2A) is configured to unlatch the power fail condition by providing a PFAIL control signal 316 (e.g., logic low) that disables transistor 408 (open state), which unlatches the power fail condition by allowing the comparison input signal 416 to reach the comparator 406 without being shorted to ground. In some embodiments, supervisory controller 124 or a component thereof (e.g., latching module 218, FIG. 2A) is also configured to force the power fail condition to occur by providing PFAIL control signal 316 (e.g., logic high) that enables transistor 408 (closed state), which shorts the comparison input signal 416 to ground, which forces the comparator 406 to generate $V_{dd}$ PFAIL signal 314. Furthermore, in some embodiments, PFAIL control signal 316 is tristated (e.g., put into a high impedance state) by supervisory controller 124 when supervisory controller 124 neither unlatches the power fail condition nor forces a power fail condition so that transistor 408 remains disabled unless PFAIL 314 is asserted (e.g., logic high). For further information concerning forcing or simulating the power fail condition, see U.S. Provisional Patent Application Ser. No. 61/903,895, filed Nov. 13, 2013, entitled "Simulated Power Failure and Data Hardening Circuitry Architecture," which is incorporated by reference herein in its entirety.

Figure 4B:
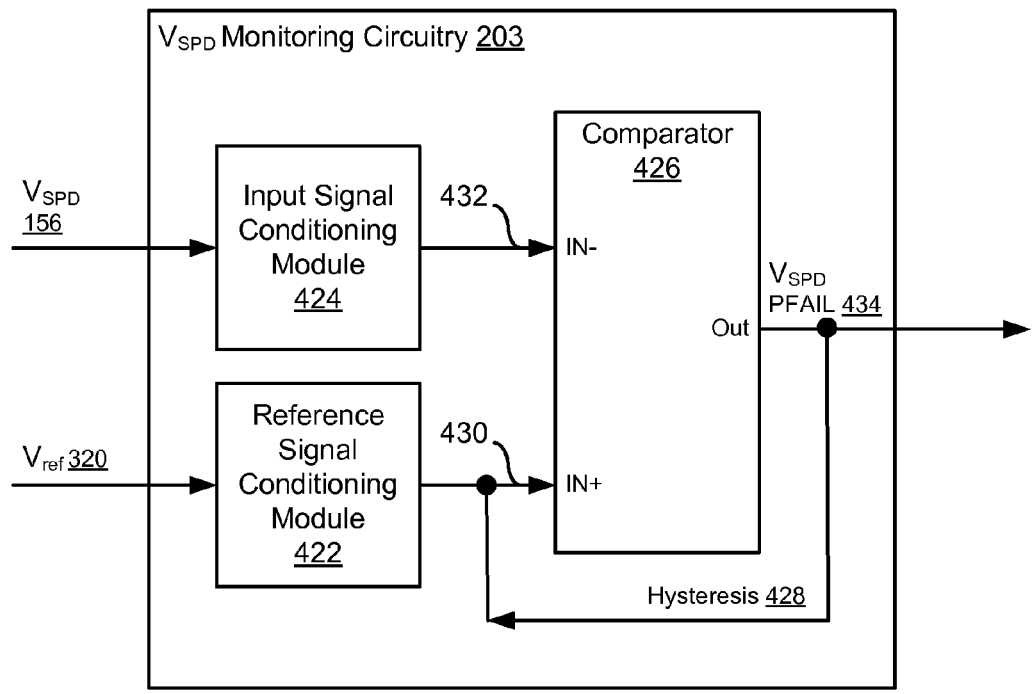
FIG. 4B is a block diagram illustrating an implementation of a portion of voltage monitoring circuitry, in accordance with some embodiments.

FIG. 4B is a block diagram illustrating an implementation of a portion of voltage monitoring circuitry ($V_{SPD}$ monitoring circuitry 203), in accordance with some embodiments. While some example features are illustrated, various other features have not been illustrated for the sake of brevity and so as not to obscure more pertinent aspects of the example implementations disclosed herein. To that end, as a non-limiting example, $V_{SPD}$ monitoring circuitry 203 includes reference signal conditioning module 422, input signal conditioning module 424, and comparator 426. In some embodiments, the reference signal $V_{ref}$ 320 is from comparator 406 of $V_{dd}$ monitoring circuitry 304, as shown in FIG. 4A. For example, in some embodiments, $V_{ref}$ 320 is a voltage-supply independent reference voltage (e.g., a predetermined voltage such as 1.23 volts). In some embodiments, $V_{ref}$ 320 is adjusted in accordance with one or more parameters of the storage device (e.g., storage device 120, FIG. 1) and a reference signal adjusting module (not shown) converts $V_{ref}$ 320 to an adjusted reference signal (e.g., trip voltage). In some embodiments, the input signal is $V_{SPD}$ 156 supplied by the host system (e.g., with a target voltage of 3.3 volts).

In some embodiments, reference signal conditioning module 422 is configured to condition $V_{ref}$ 320 (sometimes called a "reference signal," "trip voltage," "trip point," "under-voltage threshold," or "over-voltage threshold") prior to a comparison operation with this reference signal. In some embodiments, the conditioning includes one or more of buffering and filtering $V_{ref}$ 320 with a plurality of well-known circuitry components (e.g., unity gain amplifier, low-pass RC filter, etc.) to produce a conditioned $V_{ref}$ comparison signal 430. In some embodiments, input signal conditioning module 424 is configured to condition $V_{SPD}$ 156 (sometimes called an "input signal," "input voltage," "supply voltage," or "power supply voltage") supplied by the host system prior to a comparison operation with this input signal. In some embodiments, the conditioning includes one or more of buffering, filtering, and scaling $V_{SPD}$ 156 with a plurality of well-known circuitry components (e.g., unity gain amplifier, low-pass RC filter, voltage divider, etc.) to produce a conditioned $V_{SPD}$ comparison signal 432. For example, in some embodiments, input signal conditioning module 424 includes a low-pass RC filter to filter out any ripples or glitches in $V_{SPD}$ 156 and, also, a voltage divider to scale down $V_{SPD}$ 156 (e.g., from $V_{SPD}$ 156 of 3.3 volts to $V_{ref}$ 320 of 1.23 volts).

In some embodiments, comparator 426 is configured to perform a comparison operation between the conditioned reference signal 430 (e.g., the output of reference signal conditioning module 422) and the conditioned input signal 432 (e.g., the output of input signal conditioning module 424). When comparator 426 is configured to determine an under-voltage event, if the conditioned input signal 432 is less than the conditioned reference signal 430, comparator 426 is configured to output $V_{SPD}$ PFAIL signal 434 (e.g., logic high). Alternatively, when comparator 426 is configured to determine an over-voltage event, if the conditioned input signal 432 is greater than the conditioned reference signal 430, comparator 426 is configured to output $V_{SPD}$ PFAIL signal 434 (e.g., logic high). For example, in FIG. 4B, $V_{SPD}$ PFAIL signal 434 indicates the occurrence of a power fail condition (e.g., an under or over voltage event) as to $V_{SPD}$ 156. In some embodiments, comparator 426 is configured to output $V_{SPD}$ PFAIL signal 434 to supervisory controller 124. Additionally, in some embodiments, comparator 426 is configured to provide hysteresis 428 of the result of the comparison operation for subsequent comparisons. In some embodiments, comparator 406 includes multiple comparators (e.g., two comparators), and at least one of the multiple comparators is configured to determine an under-voltage event and at least one of the multiple comparators is configured to determine an over-voltage event. In some embodiments, comparator 426 is configured to receive multiple reference signals, and a first reference signal of the multiple reference signals is provided to determine an under-voltage event and a second reference signal of the multiple reference signals is provided to determine an over-voltage event.

Figure 5:
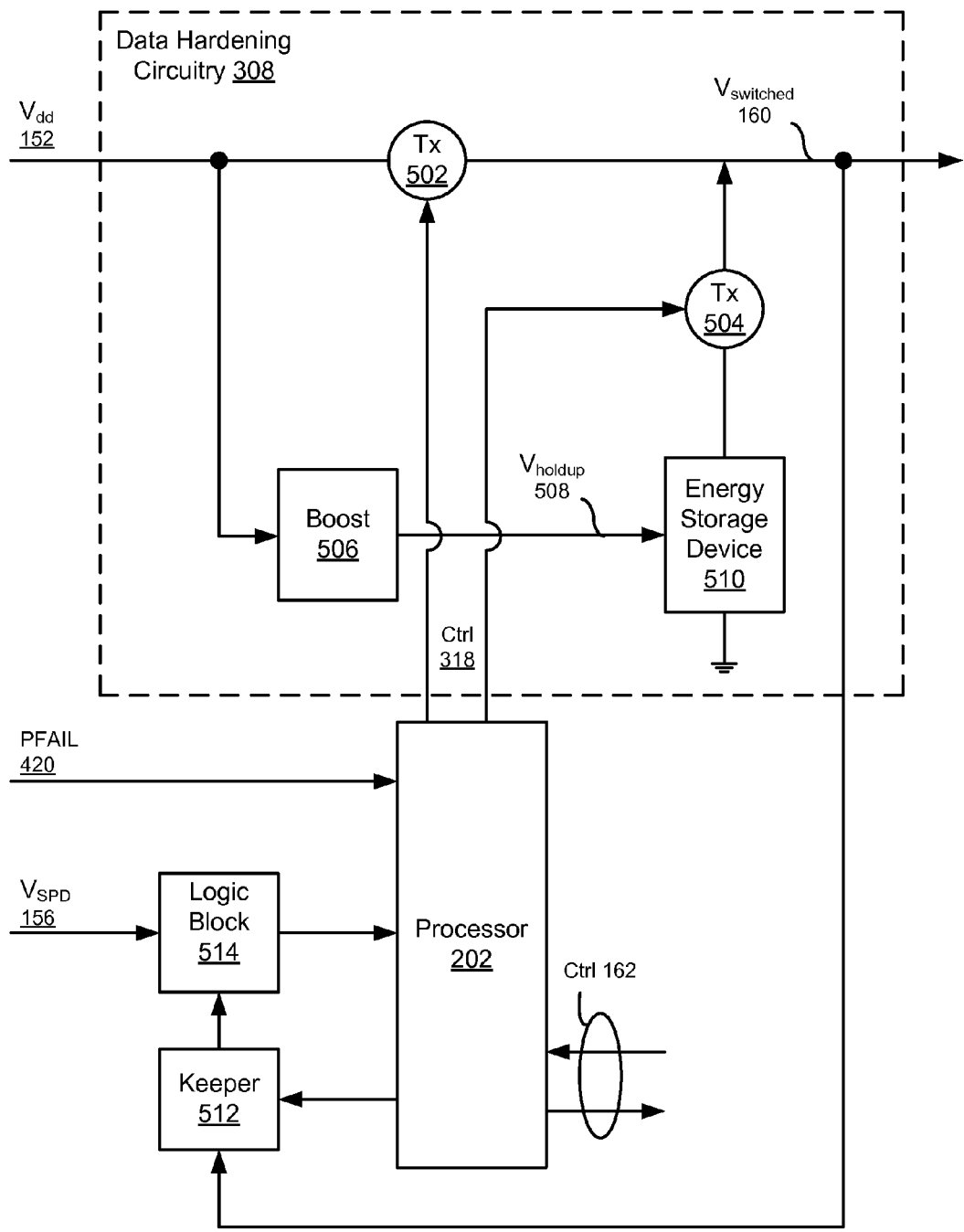
FIG. 5 is a block diagram illustrating an implementation of data hardening circuitry, in accordance with some embodiments.

FIG. 5 is a block diagram illustrating an implementation of data hardening circuitry 308, in accordance with some embodiments. While some example features are illustrated, various other features have not been illustrated for the sake of brevity and so as not to obscure more pertinent aspects of the example implementations disclosed herein. To that end, as a non-limiting example, data hardening circuitry 308 includes transistors 502 and 504, boost circuitry 506, and energy storage device 510. In some embodiments, energy storage device 510 is configured to provide power for power fail operations. In some embodiments, energy storage device 510 is configured to provide power solely for power fail operations. Further, in some embodiments, the aforementioned power fail operations include "hard power fail" operations, resulting from a detected loss of power, and "soft power fail" operations, performed in accordance with a host command or internally detected condition. In some embodiments, a primary function of a respective power fail operation is to persistently store, in non-volatile memory, data resident in volatile memory at the initiation of the power fail operation.

In some embodiments, $V_{holdup}$ 508 is a boosted voltage, higher than $V_{dd}$ 152, and has a target value of 5.7 volts. In some embodiments, $V_{holdup}$ 508 is used to charge an energy storage device 510 (e.g., one or more hold-up capacitors). Further, in some embodiments, only one of transistors 502, 504 is enabled at any one time. In some embodiments, data hardening circuit 308's energy storage device 510 stores, immediately prior to a power fail condition being detected, at least approximately 30 to 70 mJ of energy per NVM controller 130 in storage device 120.

In some embodiments, supervisory controller 124 or a component thereof (e.g., processor 202) monitors and manages the functionality of data hardening circuitry 308. For example, in response to receiving PFAIL signal 420 indicating a power fail condition, supervisory controller 124 or a component thereof (e.g., processor 202) is configured to perform one or more operations of a power fail process including controlling transistors 502 and 504 so that $V_{switched}$ 160 is the voltage from energy storage device 510, and energy storage device 510 is used (sometimes said to be "discharged") to provide power to storage device 120.

In some embodiments, during regular operation of storage device 120, $V_{dd}$ 152 is used to supply power to storage device 120. However, during the power fail process, energy storage device 510 is used to provide power to storage device 120. In some embodiments, supervisory controller 124 or a component thereof (e.g., processor 202) controls transistors 502 and 504 via control lines 318 to control $V_{switched}$ 160 to be voltage from $V_{dd}$ 152 (e.g., during regular operation) or voltage from energy storage device 510 (e.g., during the power fail process). For example, during regular operation of storage device 120, transistor 502 is turned on (e.g., to complete the connection between $V_{dd}$ 152 and $V_{switched}$ 160) and transistor 504 is turned off (e.g., to disable the connection between energy storage device 510 and $V_{switched}$ 160) so that $V_{dd}$ 152 is used to supply power to storage device 120. However, during the power fail process, transistor 502 is turned off (e.g., to disable the connection between $V_{dd}$ 152 and $V_{switched}$ 160) and transistor 504 is turned on (e.g., to enable the connection between energy storage device 510 and $V_{switched}$ 160) so that energy storage device 510 is used to provide power to storage device 120. Although a single energy storage device 510 is shown in FIG. 5, any energy storage device, including one or more capacitors, one or more inductors, or one or more other passive elements that store energy, may be used to store energy to be used during the power fail process.

In some embodiments, energy storage device 510 is charged using $V_{holdup}$ 508, a voltage higher than $V_{dd}$ 152. In some embodiments, $V_{dd}$ 152 is boosted up to $V_{holdup}$ 508 using boost circuitry 506 (e.g., 1.35 volts or 1.5 volts is boosted up to 5.7 volts). In some embodiments, boost circuitry 506 is controlled and enabled by supervisory controller 124 (e.g., via processor 202).

Further, in some embodiments, $V_{switched}$ 160 is used as an input to keeper circuitry 512, which along with $V_{SPD}$ 156 provides power to processor 202. During the power fail process, $V_{switched}$ 160 is provided via keeper circuitry 512 to processor 202 so as to provide power to processor 202. In some embodiments, $V_{SPD}$ 156 provides power to keeper circuitry 512. In some embodiments, logic block 514 (e.g., OR or XOR) determines which of keeper circuitry 512 or $V_{SPD}$ 156 provides power to supervisory controller 124 (e.g., processor 202).

Furthermore, in some embodiments, during a power up sequence, $V_{SPD}$ 156 is provided to storage device 120 before $V_{dd}$ 152 is provided to storage device 120. This allows devices in storage device 120 (e.g., supervisory controller 124 and, in turn, processor 202) to operate before main power $V_{dd}$ 152 is provided to storage device 120. In some embodiments, supervisory controller 124 or a component thereof (e.g., processor 202) includes one or more connections 162 used to monitor and control other functions within storage device 120.

Figure 6A:
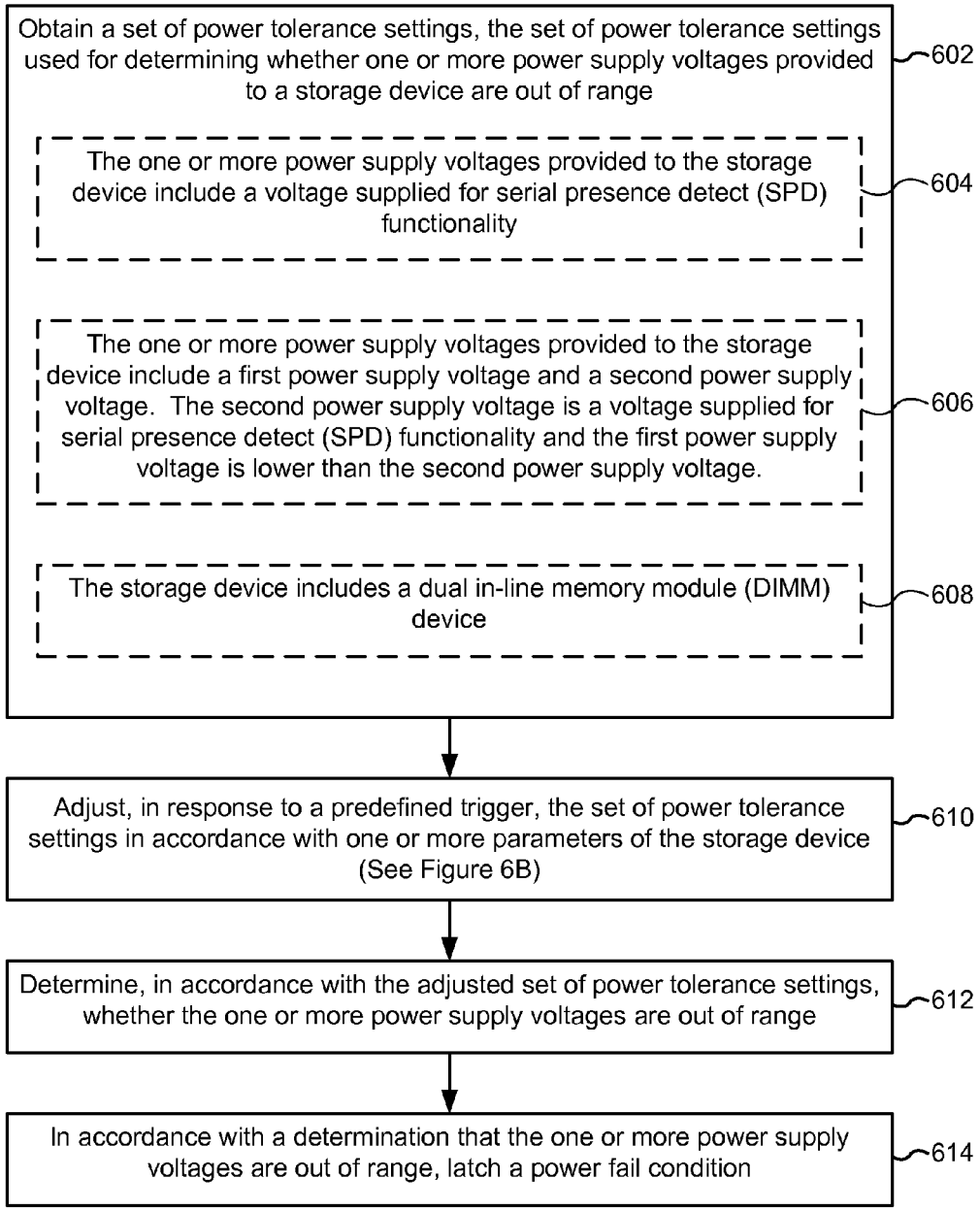
FIGS. 6A-6B illustrate a flowchart representation of a method of protecting data in a storage device, in accordance with some embodiments.
Figure 6B:
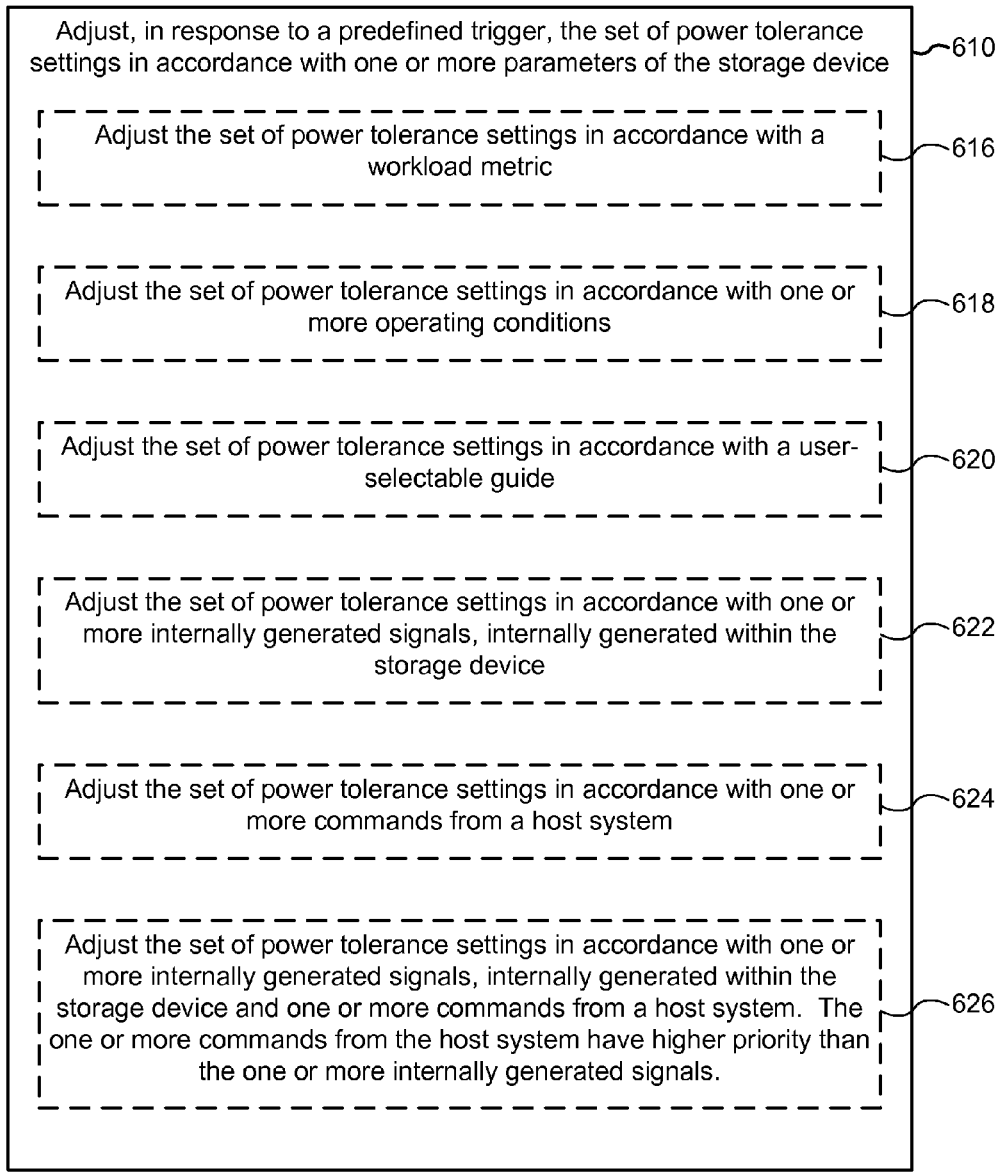

FIGS. 6A-6B illustrate a flowchart representation of method 600 of protecting data in a storage device, in accordance with some embodiments. At least in some embodiments, method 600 is performed by a storage device (e.g., storage device 120, FIG. 1) or one or more components of the storage device (e.g., supervisory controller 124, power fail module 126, memory controller 128, and/or NVM controllers 130, FIG. 1), where the storage device is operatively coupled with a host system (e.g., computer system 110, FIG. 1). In some embodiments, method 600 is governed by instructions that are stored in a non-transitory computer readable storage medium and that are executed by one or more processors of a device, such as the one or more processors 202 of supervisory controller 124, the one or more processors 252 of memory controller 128, and/or the one or more processors 272 of NVM controllers 130, as shown in FIGS. 2A-2C.

A storage device (e.g., storage device 120, FIG. 1) obtains (602) a set of power tolerance settings, and the set of power tolerance settings is used for determining whether one or more power supply voltages provided to the storage device are out of range. In some embodiments, obtaining a set of power tolerance settings includes determining a set of power tolerance settings. In some embodiments, the set of power tolerance settings includes a default set of power tolerance settings determined in accordance with a target value of one of the one or more power supply voltages provided to the storage device. For example, in some embodiments, a set of power tolerance settings is selected from a plurality of sets of power tolerance settings (e.g., in power tolerance table 236, FIG. 2A) in accordance with the target value of $V_{dd}$ (e.g., $V_{dd}$ 152, FIG. 1). Using the example where $V_{dd}$ is one of the one or more power supply voltages provided to the storage device, in some embodiments, the target value of $V_{dd}$ comprises a nominal value of $V_{dd}$ provided from the host system (e.g., 1.25 volts, 1.35 volts, or 1.5 volts). In some embodiments, the target value of $V_{dd}$ is a default supply (or input) voltage. In some embodiments, the target value of $V_{dd}$ is determined in accordance with a measurement of $V_{dd}$ performed prior to determining whether $V_{dd}$ is out of range (e.g., during, or upon completion of, power up of the storage device). For example, in some embodiments, when an initial measurement of $V_{dd}$ corresponds to 1.28 volts, 1.25 volts is selected as a target value of $V_{dd}$ (e.g., out of 1.25 volts, 1.35 volts, and 1.5 volts), and a set of power tolerance settings that corresponds to 1.25 volts is used. Although $V_{dd}$ is used as an example here, in some embodiments, the one or more power supply voltages provided to the storage device include other power supply voltages (e.g., $V_{SPD}$). In some embodiments, the set of power tolerance settings obtained for a first power supply voltage (e.g., $V_{dd}$) of the one or more power supply voltages is different from the set of power tolerance settings obtained for a second power supply voltage (e.g., $V_{SPD}$) of the one or more power supply voltages. For example, in some embodiments, different power supply voltages have different under-voltage thresholds and different over-voltage thresholds (e.g., a first under-voltage threshold is different than a second under-voltage threshold and a first over-voltage threshold is different than a second over-voltage threshold).

In some embodiments, the set of power tolerance settings includes one or more of: an under-voltage threshold, an under-voltage time period, an over-voltage threshold, and an over-voltage time period for one of the one or more power supply voltages provided to the storage device (e.g., $V_{dd}$ and/or $V_{SPD}$). For example, in some embodiments, the set of power tolerance settings includes an under-voltage threshold for $V_{dd}$ (e.g., $V_{dd}$ 152, FIG. 1), an under-voltage time period for $V_{dd}$, an over-voltage threshold for $V_{dd}$, and/or an over-voltage time period for $V_{dd}$. In some embodiments, the one or more power supply voltages include a plurality of power supply voltages provided to the storage device (e.g., $V_{dd}$ and $V_{SPD}$).

In some embodiments, the set of power tolerance settings are tailored to specific customer systems. For example, in some embodiments, Customer A has a better-regulated power supply system than Customer B, so Customer A's power supply will tolerate higher peak current and power demands than Customer B's power supply, and one or more storage devices in Customer A's system are configured to have tighter tolerance settings than one or more storage devices in Customer B's system.

In some embodiments, an obtaining module (e.g., obtaining module 212, FIG. 2A) is used to obtain a set of power tolerance settings, and the set of power tolerance settings is used for determining whether one or more power supply voltages provided to the storage device are out of range, as described above with respect to FIG. 2A.

In some embodiments, the one or more power supply voltages provided (604) to the storage device include a voltage supplied for serial presence detect (SPD) functionality. In some embodiments, the voltage supplied for SPD functionality (e.g., $V_{SPD}$ 156, FIG. 1) has a target value of 3.3 volts.

In some embodiments, the one or more power supply voltages provided (606) to the storage device include a first power supply voltage and a second power supply voltage. The second power supply voltage is a voltage supplied for serial presence detect (SPD) functionality and the first power supply voltage is lower than the second power supply voltage. In some embodiments, the second power supply voltage is a voltage supplied for SPD functionality (e.g., $V_{SPD}$ 156, FIG. 1), which has a target value of 3.3 volts, and the first power supply voltage (e.g., $V_{dd}$ 152, FIG. 1) is lower than the second power supply voltage, with a target value of 1.25 volts, 1.35 volts, or 1.5 volts. In some embodiments, the first power supply voltage is a voltage supplied for providing power to the storage device (e.g., $V_{dd}$ 152, FIG. 1). In some embodiments, the voltage supplied for providing power to the storage device includes a voltage provided to support a high level of electric power consumption by a controller. In some embodiments, the voltage supplied for providing power to the storage device includes a voltage provided to support operation of a controller at a high performance level.

In some embodiments, the storage device includes (608) a dual in-line memory module (DIMM) device. In some embodiments, the storage device is compatible with a DIMM memory slot. For example, in some embodiments, the storage device is compatible with a 240-pin DIMM memory slot using a DDR3 interface specification. In some embodiments, the storage device includes a non-volatile memory DIMM device. In some embodiments, the storage device includes a single in-line memory module (SIMM) or other types of storage devices.

The storage device adjusts (610), in response to a predefined trigger, the set of power tolerance settings in accordance with one or more parameters of the storage device. In some embodiments, the set of power tolerance settings are adjusted in accordance with one or more parameters of the storage device so that the storage device does not initiate a false power fail condition. For example, in some embodiments, the set of power tolerance settings are adjusted in accordance with one or more parameters of the storage device to reduce occurrences of a false power fail condition. In some embodiments, the one or more parameters used to adjust the set of power tolerance settings are distinct from one or more parameters used to determine the initial set of power tolerance settings. For example, in some embodiments, the obtained set of power tolerance settings is determined in accordance with a target value of one of the one or more power supply voltages provided to the storage device, and the set of power tolerance settings is adjusted in accordance with one or more parameters of the storage device, including one or more of: (1) a workload metric, (2) one or more operating conditions, (3) a user-selectable guide, (4) one or more internally generated signals, internally generated within the storage device, and (5) one or more commands from a host system, as described below.

In some embodiments, the predefined trigger includes one or more of: (1) a predefined time interval, (2) a command from a host system, (3) an internal command from within the storage device, and (4) one or more operating conditions satisfying one or more predefined operating condition requirements. For example, in some embodiments, if a PFAIL condition (e.g., $V_{dd}$ PFAIL 314 or $V_{SPD}$ PFAIL 434) is latched frequently (e.g., every two minutes), after a predefined time (e.g., thirty minutes) of frequent PFAIL conditions, the storage device adjusts the set of power tolerance settings to loosen the power tolerance settings (e.g., making the power tolerance settings more forgiving to power fluctuations). In some embodiments, loosening the power tolerance settings includes one or more of (1) increasing the over-voltage threshold, (2) decreasing the under-voltage threshold, (3) increasing the over-voltage time period, and (4) increasing the under-voltage time period.

In some embodiments, an adjusting module (e.g., adjusting module 214, FIG. 2A) is used to adjust, in response to a predefined trigger, the set of power tolerance settings in accordance with one or more parameters of the storage device, as described above with respect to FIG. 2A. In some embodiments, a plurality of adjusted sets of power tolerance settings is stored in a lookup table (e.g., power tolerance table 236, FIG. 2A) and the set of power tolerance settings with the desired level of adjustments is selected. In some embodiments, the set of power tolerance settings is adjusted in real time and the adjusted values are stored in power tolerance table 236 stored in supervisory controller 124 (FIG. 2A). In some embodiments, the set of power tolerance settings is adjusted in real time and used by one or more components of the storage device. In some embodiments, the storage device adjusts the set of power tolerance settings in accordance with one or more parameters of the storage device as described below with respect to operations 616-626 (FIG. 6B).

In some embodiments, adjusting the set of power tolerance settings in accordance with one or more parameters of the storage device includes adjusting (616, FIG. 6B) the set of power tolerance settings in accordance with a workload metric. In some embodiments, the workload metric is a sum or weighted sum of measureable events during a time period of a predefined duration. Examples of such events are read and/or write commands from a host system and internal operations such as garbage collection. In some embodiments, the measurable events include read commands. In some embodiments, the measurable events include write commands. In some embodiments, the measurable events include read and write commands. In some embodiments, different workloads cause different peak load current demands. For example, in some embodiments, when a user (e.g., a user of a host system) is running background overnight batch jobs, the workload is relaxed with minimal current demands, but as the workload increases, the current demands increase and cause more perturbation in the power supply voltage. Thus, in some embodiments, as workload increases, power tolerance settings are adjusted to be more forgiving (e.g., allowing a longer duration of and/or bigger range of acceptable voltage fluctuations). In some embodiments, adjusting the set of power tolerance settings in accordance with a workload metric includes loosening the power tolerance settings as workload increases. In some embodiments, loosening the power tolerance settings includes one or more of (1) increasing the over-voltage threshold, (2) decreasing the under-voltage threshold, (3) increasing the over-voltage time period, and (4) increasing the under-voltage time period. In some embodiments, adjusting the set of power tolerance settings in accordance with a workload metric includes tightening the power tolerance settings as workload decreases. In some embodiments, tightening the power tolerance settings includes one or more of (1) decreasing the over-voltage threshold, (2) increasing the under-voltage threshold, (3) decreasing the over-voltage time period, and (4) decreasing the under-voltage time period. In some embodiments, an adjusting module (e.g., adjusting module 214, FIG. 2A) is used to adjust the set of power tolerance settings in accordance with a workload metric, as described above with respect to FIG. 2A.

In some embodiments, adjusting the set of power tolerance settings in accordance with one or more parameters of the storage device includes adjusting (618) the set of power tolerance settings in accordance with one or more operating conditions. In some embodiments, the one or more operating conditions include one or more of: (1) temperature, (2) operating voltage, (3) history of PFAIL conditions, (4) a number of operational NVM controllers, (5) time of day, and (6) other conditions associated with the operating environment of the storage device. In some embodiments, an adjusting module (e.g., adjusting module 214, FIG. 2A) is used to adjust the set of power tolerance settings in accordance with one or more operating conditions, as described above with respect to FIG. 2A.

In some embodiments, as temperature increases, current demands increase and cause more perturbation in power supply voltages. Thus, in some embodiments, power tolerance settings are loosened at higher temperatures and tightened at lower temperatures. For example, in some embodiments, power tolerance settings are more forgiving when the storage device is at 50 degrees than when the storage device is at 25 degrees. In some embodiments, adjusting the set of power tolerance settings in accordance with one or more operating conditions includes loosening the power tolerance settings as temperature increases. In some embodiments, loosening the power tolerance settings includes one or more of (1) increasing the over-voltage threshold, (2) decreasing the under-voltage threshold, (3) increasing the over-voltage time period, and (4) increasing the under-voltage time period. In some embodiments, adjusting the set of power tolerance settings in accordance with one or more operating conditions includes tightening the power tolerance settings as temperature decreases. In some embodiments, tightening the power tolerance settings includes one or more of (1) decreasing the over-voltage threshold, (2) increasing the under-voltage threshold, (3) decreasing the over-voltage time period, and (4) decreasing the under-voltage time period.

In some embodiments, power tolerance settings are loosened at higher operating voltages and tightened at lower operating voltages. For example, in some embodiments, power tolerance settings are more forgiving when the operating voltage is 1.5 volts than when the operating voltage is at 1.25 volts. In some embodiments, adjusting the set of power tolerance settings in accordance with one or more operating conditions includes loosening the power tolerance settings as the operating voltage increases. In some embodiments, loosening the power tolerance settings includes one or more of (1) increasing the over-voltage threshold, (2) decreasing the under-voltage threshold, (3) increasing the over-voltage time period, and (4) increasing the under-voltage time period. In some embodiments, adjusting the set of power tolerance settings in accordance with one or more operating conditions includes tightening the power tolerance settings as the operating voltage decreases. In some embodiments, tightening the power tolerance settings includes one or more of (1) decreasing the over-voltage threshold, (2) increasing the under-voltage threshold, (3) decreasing the over-voltage time period, and (4) decreasing the under-voltage time period.

In some embodiments, power tolerance settings are loosened as the frequency of PFAIL conditions increases and tightened as the frequency of PFAIL conditions decreases. For example, in some embodiments, if a history of PFAIL conditions shows that the storage device latches a PFAIL condition with a high frequency (e.g., every two minutes), power tolerance settings are loosened. In some embodiments, historic power characteristics based on recorded power events (e.g., history and/or frequency of PFAIL conditions) are stored in non-volatile memory associated with the supervisory controller, such as event log 238, FIG. 2A). In some embodiments, adjusting the set of power tolerance settings in accordance with one or more operating conditions includes loosening the power tolerance settings as the frequency of PFAIL conditions increases. In some embodiments, loosening the power tolerance settings includes one or more of (1) increasing the over-voltage threshold, (2) decreasing the under-voltage threshold, (3) increasing the over-voltage time period, and (4) increasing the under-voltage time period. In some embodiments, adjusting the set of power tolerance settings in accordance with one or more operating conditions includes tightening the power tolerance settings as the frequency of PFAIL conditions decreases. In some embodiments, tightening the power tolerance settings includes one or more of (1) decreasing the over-voltage threshold, (2) increasing the under-voltage threshold, (3) decreasing the over-voltage time period, and (4) decreasing the under-voltage time period.

In some embodiments, power tolerance settings are loosened as the number of operational NVM controllers (e.g., NVM controllers 130, FIG. 1) increases and tightened as the number of operational NVM controllers decreases. For example, in some embodiments, power tolerance settings are more forgiving when the storage device has two operational NVM controllers than when the storage device has one operational NVM controller. In some embodiments, adjusting the set of power tolerance settings in accordance with one or more operating conditions includes loosening the power tolerance settings as the number of operational NVM controllers increases. In some embodiments, loosening the power tolerance settings includes one or more of (1) increasing the over-voltage threshold, (2) decreasing the under-voltage threshold, (3) increasing the over-voltage time period, and (4) increasing the under-voltage time period. In some embodiments, adjusting the set of power tolerance settings in accordance with one or more operating conditions includes tightening the power tolerance settings as the number of operational NVM controllers decreases. In some embodiments, tightening the power tolerance settings includes one or more of (1) decreasing the over-voltage threshold, (2) increasing the under-voltage threshold, (3) decreasing the over-voltage time period, and (4) decreasing the under-voltage time period.

In some embodiments, power tolerance settings are adjusted based on time of day. For example, in some embodiments, day-time jobs require maximum performance of a computer system and introduce high operation stress conditions, while night-time jobs are less demanding. In some embodiments, a host system (e.g., computer system 110, FIG. 1) communicates a "time of day" to the storage device. In some embodiments, the storage device has an onboard "time of day" function. In some embodiments, adjusting the set of power tolerance settings in accordance with one or more operating conditions includes loosening the power tolerance settings for a first portion of the day (e.g., from 8 AM to 8 PM). In some embodiments, loosening the power tolerance settings includes one or more of (1) increasing the over-voltage threshold, (2) decreasing the under-voltage threshold, (3) increasing the over-voltage time period, and (4) increasing the under-voltage time period. In some embodiments, adjusting the set of power tolerance settings in accordance with one or more operating conditions includes tightening the power tolerance settings for a second portion of the day (e.g., from 8 PM to 8 AM). In some embodiments, tightening the power tolerance settings includes one or more of (1) decreasing the over-voltage threshold, (2) increasing the under-voltage threshold, (3) decreasing the over-voltage time period, and (4) decreasing the under-voltage time period.

In some embodiments, adjusting the set of power tolerance settings in accordance with one or more parameters of the storage device includes adjusting (620) the set of power tolerance settings in accordance with a user-selectable guide. In some embodiments, a user-selectable guide includes a plurality of predefined modes (e.g., high sensitivity mode, medium sensitivity mode, low sensitivity mode, etc.), each mode corresponding to a predefined set of power tolerance settings. For example, in some embodiments, if the storage device is used for critical data, a user selects a first mode (e.g., high sensitivity mode with tighter tolerances), and if the storage device is used for non-critical data, a user selects a second mode (e.g., low sensitivity mode with looser tolerances). In some embodiments, each mode of the plurality of predefined modes includes a plurality of settings associated with that mode (e.g., under-voltage threshold, over-voltage threshold, under-voltage time period, and over-voltage time period). In some embodiments, adjusting the set of power tolerance settings in accordance with a user-selectable guide includes adjusting each setting of the plurality of settings associated with a mode. In some embodiments, adjusting the set of power tolerance settings in accordance with a user-selectable guide includes adjusting one setting of the plurality of settings associated with a mode. In some embodiments, an adjusting module (e.g., adjusting module 214, FIG. 2A) is used to adjust the set of power tolerance settings in accordance with a user-selectable guide, as described above with respect to FIG. 2A.

In some embodiments, adjusting the set of power tolerance settings in accordance with one or more parameters of the storage device includes adjusting (622) the set of power tolerance settings in accordance with one or more internally generated signals, internally generated within the storage device. In some embodiments, adjusting the set of power tolerance settings in accordance with one or more parameters of the storage device includes automatically adjusting the set of power tolerance settings in accordance with one or more internally generated signals, internally generated within the storage device. In some embodiments, adjusting the set of power tolerance settings in accordance with one or more parameters of the storage device includes adjusting the set of power tolerance settings independent of a host command. In some embodiments, adjusting the set of power tolerance settings in accordance with one or more internally generated signals includes adjusting the power tolerance settings in accordance with a workload metric and/or one or more operating conditions, as described above with respect to operations 616 and 618, respectively. In some embodiments, an adjusting module (e.g., adjusting module 214, FIG. 2A) is used to adjust the set of power tolerance settings in accordance with one or more internally generated signals, internally generated within the storage device, as described above with respect to FIG. 2A.

In some embodiments, adjusting the set of power tolerance settings in accordance with one or more parameters of the storage device includes adjusting (624) the set of power tolerance settings in accordance with one or more commands from a host system. For example, in some embodiments, one or more commands from the host system initiates adjusting the set of power tolerance settings. In some embodiments, the one or more commands from the host system initiates replacing one or more parameters of the set of power tolerance settings with one or more parameters provide with the one or more commands from the host system. In some embodiments, as described above with respect to operation 620, adjusting the set of power tolerance settings in accordance with one or more commands from a host system includes adjusting the power tolerance settings in accordance with a user-selectable guide. In some embodiments, one or more commands from the host system initiates selection of a predefined mode of a plurality of predefined modes (e.g., high sensitivity mode, medium sensitivity mode, low sensitivity mode, etc.), each mode corresponding to a predefined set of power tolerance settings. In some embodiments, an adjusting module (e.g., adjusting module 214, FIG. 2A) is used to adjust the set of power tolerance settings in accordance with one or more commands from a host system, as described above with respect to FIG. 2A.

In some embodiments, adjusting the set of power tolerance settings in accordance with one or more parameters of the storage device includes adjusting (626) the set of power tolerance settings in accordance with one or more internally generated signals, internally generated within the storage device and one or more commands from a host system. The one or more commands from the host system (e.g., computer system 110, FIG. 1) have higher priority than the one or more internally generated signals (e.g., internally generated within storage device 120, FIG. 1). In some embodiments, the storage device is configured to both (i) receive one or more commands from the host system and (ii) internally generate one or more signals within the storage device, for adjusting the set of power tolerance settings. In some embodiments, in accordance with a determination that adjusting the set of power tolerance settings in accordance with one or more internally generated signals is in conflict with adjusting the set of power tolerance settings in accordance with one or more commands from a host system, the storage device adjusts the set of power tolerance settings in accordance with the one or more commands from a host system, independent of the one or more internally generated signals. For example, in some embodiments, as workload increases, power tolerance settings are adjusted to be more forgiving (e.g., in accordance with one or more internally generated signals); however, if a user selects a high sensitivity mode with tighter tolerances (e.g., in accordance with one or more commands from a host system), the set of power tolerance settings are adjusted in accordance with the user's selection of the high sensitivity mode and the power tolerance settings are tightened, despite the workload increasing. In some embodiments, an adjusting module (e.g., adjusting module 214, FIG. 2A) is used to adjust the set of power tolerance settings in accordance with one or more internally generated signals, internally generated within the storage device and one or more commands from a host system. The one or more commands from the host system have higher priority than the one or more internally generated signals, as described above with respect to FIG. 2A.

The storage device determines (612, FIG. 6A), in accordance with the adjusted set of power tolerance settings, whether the one or more power supply voltages are out of range. For example, in some embodiments, the storage device determines, in accordance with the adjusted set of power tolerance settings, whether $V_{dd}$ (e.g., $V_{dd}$ 152, FIG. 1) is out of range. In some embodiments, a voltage module (e.g., voltage module 210, FIG. 2A) is used to determine, in accordance with the adjusted set of power tolerance settings, whether the one or more power supply voltages are out of range, as described above with respect to FIG. 2A. In some embodiments, the storage device determines whether the one or more power supply voltages are out of range using voltage monitoring circuitry (e.g., $V_{dd}$ monitoring circuitry 304, voltage monitoring circuitry 302, and/or $V_{SPD}$ monitoring circuitry 203, FIG. 3).

In some embodiments, a first power supply voltage of the one or more power supply voltages is out of range when the first power supply voltage is lower than a first under-voltage threshold for a first under-voltage time period. For example, in some embodiments, if the first under-voltage threshold is 1.425 volts and the first under-voltage time period is 100 microseconds, the storage device, in accordance with a determination that the first power supply voltage (e.g., $V_{dd}$ 152, FIG. 1) is lower than 1.425 volts for 100 microseconds, determines that the first power supply voltage is out of range. In some embodiments, the first under-voltage threshold and the first under-voltage time period are included in an adjusted set of power tolerance settings, the adjusted set of power tolerance settings corresponding to a target value of the first power supply voltage. In some embodiments, one or more of the first under-voltage threshold and the first under-voltage time period are adjustable based on one or more parameters including: (1) customer-specific power characteristics, (2) sensitivity of data (e.g., whether system critical data is stored on the storage device), (3) historic power characteristics based on recorded power events (e.g., stored in non-volatile memory associated with supervisory controller 124, FIG. 2A), and/or (4) one or more parameters of the storage device, as described above with respect to operations 616-626.

In some embodiments, a first power supply voltage of the one or more power supply voltages is out of range when the first power supply voltage is higher than a first over-voltage threshold for a first over-voltage time period. For example, in some embodiments, if the first over-voltage threshold is 1.575 volts and the first over-voltage time period is 1 millisecond, the storage device, in accordance with a determination that the first power supply voltage (e.g., $V_{dd}$ 152, FIG. 1) is greater than 1.575 volts for 1 millisecond, determines that the first power supply voltage is out of range. In some embodiments, the first over-voltage threshold and the first over-voltage time period are included in the adjusted set of power tolerance settings. In some embodiments, the first over-voltage threshold and/or the first over-voltage time period are adjustable based on one or more parameters including: (1) customer-specific power characteristics, (2) sensitivity of data (e.g., whether system critical data is stored on the storage device), (3) historic power characteristics based on recorded power events (e.g., stored in non-volatile memory associated with supervisory controller 124, FIG. 2A), and/or (4) one or more parameters of the storage device, as described above with respect to operations 616-626.

In some embodiments, determining whether a first power supply voltage of the one or more power supply voltages provided to the storage device is out of range includes determining whether the first power supply voltage is lower than the first under-voltage threshold for the first under-voltage time period, and determining whether the first power supply voltage is higher than the first over-voltage threshold for the first over-voltage time period. In some embodiments, determining whether a second power supply voltage of the one or more power supply voltages provided to the storage device is out of range includes determining whether the second power supply voltage is lower than the second under-voltage threshold for the second under-voltage time period, and determining whether the second power supply voltage is higher than the second over-voltage threshold for the second over-voltage time period.

In some embodiments, the first under-voltage threshold is distinct and independent from the second under-voltage threshold. In some embodiments, the first under-voltage time period is distinct and independent from the second under-voltage time period. In some embodiments, the first over-voltage threshold is distinct and independent from the second over-voltage threshold. In some embodiments, the first over-voltage time period is distinct and independent from the second over-voltage time period.

In some embodiments, determining whether the one or more power supply voltages are out of range includes (1) monitoring the one or more power supply voltages, (2) comparing the one or more power supply voltages to one or more under-voltage thresholds, respectively, and (3) in accordance with a determination that the one or more power supply voltages are less than the one or more respective under-voltage thresholds, determining the one or more power supply voltages are out of range. In some embodiments, determining, in accordance with the adjusted set of power tolerance settings, whether the one or more power supply voltages are out of range includes determining whether the one or more power supply voltages are out of range for a predefined time period, the predefined time period included in the adjusted set of power tolerance settings.

In some embodiments, determining whether the one or more power supply voltages are out of range includes monitoring the one or more power supply voltages. In some embodiments, the storage device or a component thereof is configured to monitor the one or more power supply voltages (e.g., $V_{dd}$ 152 and/or $V_{SPD}$ 156, FIG. 1). In some embodiments, storage device 120 monitors $V_{dd}$ 152 using $V_{dd}$ monitoring circuitry 304 (FIG. 3). In some embodiments, storage device 120 monitors $V_{SPD}$ 156 using $V_{SPD}$ monitoring circuitry 203 (FIG. 3). In some embodiments, supervisory controller 124 or a component thereof is configured to receive an indication of the default supply (or input) voltage (e.g., 1.25 volts, 1.35 volts, or 1.5 volts for $V_{dd}$ and/or 3.3 volts for $V_{SPD}$) from a host system (e.g., computer system 110, FIG. 1). In some embodiments, storage device 120 is configured to receive the indication of the default supply (or input) voltage. For example, in some embodiments, an indication of the default supply voltage is received via SPD Bus 154 from the host system. In some embodiments, a monitoring module (e.g., monitoring module 218) is used to monitor the one or more power supply voltages, as described above with respect to FIG. 2A.

In some embodiments, determining whether the one or more power supply voltages are out of range includes comparing the one or more power supply voltages to one or more under-voltage thresholds (e.g., each under-voltage threshold in an adjusted set of power tolerance settings), respectively. In some embodiments, a comparing module (e.g., comparing module 222, FIG. 2A) is used to compare the one or more power supply voltages to one or more under-voltage thresholds, respectively, as described above with respect to FIG. 2A. In some embodiments, the storage device compares one of the one or more power supply voltages to a respective under-voltage threshold using voltage monitoring circuitry (e.g., $V_{dd}$ monitoring circuitry 304, voltage monitoring circuitry 302, and/or $V_{SPD}$ monitoring circuitry 203, FIG. 3).

In some embodiments, supervisory controller 124 or a component thereof (e.g., threshold module 220, FIG. 2A) is configured to select an under-voltage threshold by selecting a set of power tolerance settings (including an under-voltage threshold) from a plurality of sets of power tolerance settings stored in power tolerance table 236 (FIG. 2A) based on one or more configuration parameters. In some embodiments, power tolerance table 236 (FIG. 2A) includes a set of power tolerance settings (e.g., an under-voltage threshold, an under-voltage time period, an over-voltage threshold, and/or an over-voltage time period) for each of a plurality of potential default input voltages supplied by a host system or voltage classes of storage device 120 (e.g., 1.25 volts, 1.35 volts, or 1.5 volts). For example, if the one or more configuration parameters indicate that the default input voltage (e.g., $V_{dd}$) is 1.5 volts, threshold module 220 selects a set of power tolerance settings from power tolerance table 236 (FIG. 2A) that corresponds to a default input voltage of 1.5 volts. In some embodiments, a threshold module (e.g., threshold module 220, FIG. 2A) is used to obtain the aforementioned under-voltage thresholds from one or more sets of power tolerance settings, as described above with respect to FIG. 2A. In some embodiments, determining whether the one or more power supply voltages are out of range includes determining, in accordance with a determination that the one or more power supply voltages are less than the one or more respective under-voltage thresholds, that the one or more power supply voltages are out of range.

Although the descriptions above have used an under-voltage threshold to determine whether the one or more power supply voltages provided to the storage device are out of range, over-voltage thresholds may be used to determine whether the one or more power supply voltages provided to the storage device are out of range. For example, using $V_{dd}$ as an example, in some embodiments, determining whether $V_{dd}$ is out of range includes: (1) monitoring $V_{dd}$, (2) comparing $V_{dd}$ with an over-voltage threshold, the over-voltage threshold determined in accordance with a target value of $V_{dd}$, and (3) in accordance with a determination that $V_{dd}$ is greater than the over-voltage threshold, determining $V_{dd}$ is out of range. Although $V_{dd}$ is used as an example here, in some embodiments, the one or more power supply voltages provided to the storage device include other power supply voltages (e.g., $V_{SPD}$).

The storage device, in accordance with a determination that the one or more power supply voltages are out of range, latches (614) a power fail condition. In some embodiments, a first power supply voltage of the one or more power supply voltages provided to the storage device is out of range when the first power supply voltage is lower than a first under-voltage threshold. In some embodiments, the first power supply voltage provided to the storage device is out of range when the first power supply voltage is higher than a first over-voltage threshold. In some embodiments, a second power supply voltage of the one or more power supply voltages provided to the storage device is out range when the second power supply voltage is lower than a second under-voltage threshold. In some embodiments, the second power supply voltage provided to the storage device is out range when the second power supply voltage is higher than a second over-voltage threshold. In some embodiments, different power supply voltages of the one or more power supply voltages have different under-voltage thresholds and different over-voltage thresholds (e.g., the first under-voltage threshold is different than the second under-voltage threshold and the first over-voltage threshold is different than the second over-voltage threshold). In some embodiments, a latching module (e.g., latching module 224, FIG. 2A) is used to, in accordance with a determination that one or more power supply voltages are out of range, latch a power fail condition, as described above with respect to FIG. 2A.

In some embodiments, the storage device performs a power fail operation in accordance with the power fail condition, the power fail operation including: (1) transferring data held in volatile memory to non-volatile memory, and (2) removing power from a plurality of controllers on the storage device. In some embodiments, the power fail operation includes signaling the power fail condition to a plurality of controllers on the storage device (e.g., memory controller 128 and NVM controllers 130, FIG. 1). In some embodiments, a power fail operation module on one or more controllers (e.g., power fail operation module 264, FIG. 2B, and power fail operation module 284, FIG. 2C) are used to transfer data held in volatile memory to non-volatile memory, as described above with respect to FIGS. 2B-2C. In some embodiments, removing power from the plurality of controllers on the storage device include affirmatively removing power from the plurality of controllers (as opposed to allowing the plurality of controllers to automatically lose power). In some embodiments, a power removal module (e.g., power removal module 232, FIG. 2A) is used to remove power from the plurality of controllers on the storage device, as described above with respect to FIG. 2A.

In some embodiments, the non-volatile memory comprises one or more flash memory devices (e.g., NVM devices 140, 142, FIG. 1). In some embodiments, the non-volatile memory includes a single flash memory device, while in other embodiments the non-volatile memory includes a plurality of flash memory devices. In some embodiments, the non-volatile memory includes NAND-type flash memory or NOR-type flash memory. In other embodiments, the non-volatile memory comprises one or more other types of non-volatile storage devices.

In some embodiments, the power fail operation is performed to completion regardless of whether the one or more power supply voltages return to within range. For example, in some embodiments, the power fail operation is performed to completion even if a first power supply voltage of the one or more power supply voltages returns to within range after a first time period or a second power supply voltage of the one or more power supply voltages returns to within rage after a second time period. In some embodiments, even if the power fail condition is temporary (e.g., a lightning strike that briefly causes the power supply voltage to flicker below the undervoltage threshold), as long as one (or more) of the one or more power supply voltages were out of range for respective time periods, the power fail condition is latched and the power fail operation is performed to completion. In some embodiments, once a power fail operation begins, data hardening circuitry (e.g., data hardening circuitry 308, FIGS. 3 and 5) effectively disconnects from the power supply voltage provided to the storage device (e.g., $V_{dd}$) and ignores the power supply voltage until the power fail operation is complete.

In some embodiments, the storage device includes an energy storage device (e.g., energy storage device 510, FIG. 5), and the power fail operation is performed using power from the energy storage device. As described above with respect to FIG. 5, during a power fail operation, an energy storage device (e.g., energy storage device 510, FIG. 5) is used to provide power to the storage device, and data hardening circuitry (e.g., data hardening circuitry 308, FIGS. 3 and 5) is used to connect and disconnect the appropriate power sources (e.g., disabling the connection between $V_{dd}$ 152 and $V_{switched}$ 160 and enabling the connection between energy storage device 510 and $V_{switched}$ 160, FIG. 5).

In some embodiments, the energy storage device includes one or more capacitors. For example, in some embodiments, the energy storage device includes a single capacitor, while in other embodiments, the energy storage device includes a plurality of capacitors. In some embodiments, the energy storage device includes one or more inductors. In some embodiments, the energy storage device includes one or more other passive elements that store energy.

In some embodiments, the plurality of controllers on the storage device includes at least one non-volatile memory controller and at least one other memory controller other than the at least one non-volatile memory controller. In some embodiments, the at least one non-volatile memory controller is a NVM controller (e.g., NVM controller 130-1, FIG. 1). In some embodiments, the at least one non-volatile memory controller is a flash controller. In some embodiments, the at least one non-volatile memory controller controls one or more other types of non-volatile memory devices.

In some embodiments, one of the plurality of controllers on the storage device maps double data rate (DDR) interface commands to serial advance technology attachment (SATA) interface commands. For example, a memory controller (e.g., memory controller 128, FIG. 1) maps double data rate type three (DDR3) interface commands to SATA interface commands. In some embodiments, a memory controller (e.g., memory controller 128, FIG. 1) uses a defined interface standard, such as DDR3, to communicate with a host interface (e.g., host interface 122, FIG. 1) and uses a defined interface standard, such as SATA, to communicate with other controllers on the storage device (e.g., NVM controllers 130, FIG. 1).

In some embodiments, the plurality of controllers on the storage device includes a memory controller (e.g., memory controller 128, FIG. 1) and one or more flash controllers (e.g., NVM controllers 130, FIG. 1). The one or more flash controllers are coupled by the memory controller to a host interface (e.g., host interface 122, FIG. 1) of the storage device.

In some embodiments, transferring data held in volatile memory to non-volatile memory includes transferring data (e.g., volatile memory 268, FIG. 2B) from the memory controller (e.g., memory controller 128, FIG. 1) to the one or more flash controllers (e.g., NVM controllers 130, FIG. 1). In some embodiments, data transferred from the memory controller to the one or more flash controllers includes data in flight from the host interface (e.g., host interface 122, FIG. 1) to the memory controller, data that has been signaled to the host (e.g., computer system 110, FIG. 1) as saved (e.g., stored in a non-volatile store or write cache), and/or metadata stored in volatile memory (e.g., volatile memory 268, FIG. 2B) of the memory controller. In some embodiments, a transfer module (e.g., transfer module 266, FIG. 2B) is used to transfer data from the memory controller to the one or more flash controllers, as described above with respect to FIG. 2B.

In some embodiments, transferring data held in volatile memory to non-volatile memory includes transferring data (e.g., volatile memory 288, FIG. 2C) from the one or more flash controllers (e.g., NVM controllers 130, FIG. 1) to the non-volatile memory (e.g., NVM devices 140, 142, FIG. 1). In some embodiments, data transferred from the one or more flash controllers to the non-volatile memory includes data in flight to the one or more flash controllers and/or metadata stored in volatile memory (e.g., volatile memory 288, FIG. 2C) of the one or more flash controllers (e.g., unwritten parity data, information about current age of the flash memory devices, translation tables, etc.). In some embodiments, a transfer module (e.g., transfer module 286, FIG. 2C) is used to transfer data from the one or more flash controllers to the non-volatile memory, as described above with respect to FIG. 2C.

It will be understood that, although the terms "first," "second," etc. may be used herein to describe various elements, these elements should not be limited by these terms. These terms are only used to distinguish one element from another. For example, a first power supply voltage could be termed a second power supply voltage, and, similarly, a second power supply voltage could be termed a first power supply voltage, without changing the meaning of the description, so long as all occurrences of the "first power supply voltage" are renamed consistently and all occurrences of the "second power supply voltage" are renamed consistently. The first power supply voltage and the second power supply voltage are both power supply voltages, but they are not the same power supply voltage.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of protecting data in a storage device, the method comprising:
   obtaining a set of power tolerance settings, the set of power tolerance settings used for determining whether one or more power supply voltages provided to the storage device are out of range;
   in response to a predefined trigger, adjusting the set of power tolerance settings in accordance with one or more parameters of the storage device;
   determining, in accordance with the adjusted set of power tolerance settings, whether the one or more power supply voltages are out of range; and,
   in accordance with a determination that the one or more power supply voltages are out of range, latching a power fail condition.

2. The method of claim 1, wherein the one or more power supply voltages provided to the storage device include a voltage supplied for serial presence detect (SPD) functionality.

3. The method of claim 1, wherein the one or more power supply voltages provided to the storage device include a first power supply voltage and a second power supply voltage, wherein the second power supply voltage is a voltage supplied for serial presence detect (SPD) functionality and the first power supply voltage is lower than the second power supply voltage.

4. The method of claim 1, wherein adjusting the set of power tolerance settings in accordance with one or more parameters of the storage device includes adjusting the set of power tolerance settings in accordance with a workload metric.

5. The method of claim 1, wherein adjusting the set of power tolerance settings in accordance with one or more parameters of the storage device includes adjusting the set of power tolerance settings in accordance with one or more operating conditions.

6. The method of claim 1, wherein adjusting the set of power tolerance settings in accordance with one or more parameters of the storage device includes adjusting the set of power tolerance settings in accordance with a user-selectable guide.

7. The method of claim 1, wherein adjusting the set of power tolerance settings in accordance with one or more parameters of the storage device includes adjusting the set of power tolerance settings in accordance with one or more internally generated signals, internally generated within the storage device.

8. The method of claim 1, wherein adjusting the set of power tolerance settings in accordance with one or more parameters of the storage device includes adjusting the set of power tolerance settings in accordance with one or more commands from a host system.

9. The method of claim 1, wherein adjusting the set of power tolerance settings in accordance with one or more parameters of the storage device includes adjusting the set of power tolerance settings in accordance with one or more internally generated signals, internally generated within the storage device and one or more commands from a host system, wherein the one or more commands from the host system have higher priority than the one or more internally generated signals.

10. The method of claim 1, wherein the storage device includes a dual in-line memory module (DIMM) device.

11. A storage device, comprising:
    an interface for operatively coupling the storage device with a host system;
    the storage device configured to:
      obtain a set of power tolerance settings, the set of power tolerance settings used for determining whether one or more power supply voltages provided to the storage device are out of range;
      in response to a predefined trigger, adjust the set of power tolerance settings in accordance with one or more parameters of the storage device;
      determine, in accordance with the adjusted set of power tolerance settings, whether the one or more power supply voltages are out of range; and,
      in accordance with a determination that the one or more power supply voltages are out of range, latch a power fail condition.

12. The storage device of claim 11, wherein the one or more power supply voltages provided to the storage device include a voltage supplied for serial presence detect (SPD) functionality.

13. The storage device of claim 11, wherein the one or more power supply voltages provided to the storage device include a first power supply voltage and a second power supply voltage, wherein the second power supply voltage is a voltage supplied for serial presence detect (SPD) functionality and the first power supply voltage is lower than the second power supply voltage.

14. The storage device of claim 11, wherein the storage device is configured to adjust the set of power tolerance settings in accordance with one or more parameters of the storage device by adjusting the set of power tolerance settings in accordance with a workload metric.

15. The storage device of claim 11, wherein the storage device is configured to adjust the set of power tolerance settings in accordance with one or more parameters of the storage device by adjusting the set of power tolerance settings in accordance with one or more operating conditions.

16. The storage device of claim 11, wherein the storage device is configured to adjust the set of power tolerance settings in accordance with one or more parameters of the storage device by adjusting the set of power tolerance settings in accordance with a user-selectable guide.

17. The storage device of claim 11, wherein the storage device is configured to adjust the set of power tolerance settings in accordance with one or more parameters of the storage device by adjusting the set of power tolerance settings in accordance with one or more internally generated signals, internally generated within the storage device.

18. The storage device of claim 11, wherein the storage device is configured to adjust the set of power tolerance settings in accordance with one or more parameters of the storage device by adjusting the set of power tolerance settings in accordance with one or more commands from a host system.

19. The storage device of claim 11, wherein the storage device is configured to adjust the set of power tolerance settings in accordance with one or more parameters of the storage device by adjusting the set of power tolerance settings in accordance with one or more internally generated signals, internally generated within the storage device and one or more commands from a host system, wherein the one or more commands from the host system have higher priority than the one or more internally generated signals.

20. A non-transitory computer readable storage medium, storing one or more programs for execution by one or more processors of a storage device, the one or more programs including instructions for:
- obtaining a set of power tolerance settings, the set of power tolerance settings used for determining whether one or more power supply voltages provided to the storage device are out of range;
- in response to a predefined trigger, adjusting the set of power tolerance settings in accordance with one or more parameters of the storage device;
- determining, in accordance with the adjusted set of power tolerance settings, whether the one or more power supply voltages are out of range; and,
- in accordance with a determination that the one or more power supply voltages are out of range, latching a power fail condition.

* * * * *